(12) United States Patent
Kim et al.

(10) Patent No.: US 7,489,570 B2
(45) Date of Patent: Feb. 10, 2009

(54) SEMICONDUCTOR MEMORY DEVICE WITH HIERARCHICAL BIT LINE STRUCTURE

(75) Inventors: Nam-Seog Kim, Suwon-si (KR); Jong-Cheol Lee, Seongnam-si (KR); Hak-Soo Yu, Seongnam-si (KR); Uk-Rae Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 296 days.

(21) Appl. No.: 11/480,447

(22) Filed: Jul. 5, 2006

(65) Prior Publication Data

US 2007/0115710 A1    May 24, 2007

(30) Foreign Application Priority Data

Nov. 22, 2005    (KR) ............... 10-2005-0111566

(51) Int. Cl.
*G11C 7/00* (2006.01)
(52) U.S. Cl. .............. 365/198; 365/63; 365/185.13
(58) Field of Classification Search .............. 365/198, 365/63, 185.13
See application file for complete search history.

(56) References Cited

U.S. PATENT DOCUMENTS

| | | | |
|---|---|---|---|
| 5,764,562 A * | 6/1998 | Hamamoto | ............... 365/149 |
| 5,986,914 A | 11/1999 | McClure | |
| 6,163,475 A * | 12/2000 | Proebsting | ............... 365/63 |
| 6,452,861 B1 * | 9/2002 | Hirose | ............... 365/189.15 |
| 6,542,428 B2 * | 4/2003 | Hidaka | ............... 365/230.03 |
| 6,717,879 B2 * | 4/2004 | Tanaka | ............... 365/189.18 |
| 6,822,918 B2 | 11/2004 | Slamowitz et al. | |

* cited by examiner

*Primary Examiner*—Tuan T. Nguyen
(74) *Attorney, Agent, or Firm*—Volentine & Whitt, PLLC

(57) ABSTRACT

A semiconductor memory device has a hierarchical bit line structure. The semiconductor memory device may include first and second memory cell clusters, which share the same bit line pair and are divided operationally; third and fourth memory cell clusters, which are connected respectively corresponding to word lines coupled with the first and second memory cell clusters, and which share a bit line pair different from the bit line pair and are divided operationally; and a column pass gate for switching one of bit line pairs connected with the first to fourth memory cell clusters, to a common sense amplifier, in response to a column selection signal. Whereby an operating speed decrease caused by load of peripheral circuits connected to the bit line is improved, and the number of column pass gates is reduced substantially with a reduction of chip size.

11 Claims, 20 Drawing Sheets

SEMICONDUCTOR MEMORY DEVICE WITH HIERARCHICAL BIT LINE STRUCTURE

BACKGROUND OF THE INVENTION

1. Field of the Invention

Embodiments of the present invention relate generally to semiconductor memory devices. More particularly, embodiments of the invention relate to a semiconductor memory device having a hierarchical bit line structure and an associated data path.

A claim of priority is made to Korean Patent Application 10-2005-0111566, filed on Nov. 22, 2005, the disclosure of which is hereby incorporated by reference in its entirety.

2. Description of Related Art

Modern computing applications continue to demand semiconductor memory devices with larger capacity, higher performance, and lower power consumption. As a practical matter, it can be difficult to simultaneously achieve all three objectives, as there tend to be tradeoffs between capacity, performance, and power consumption.

As a general rule, the capacity and performance of semiconductor memory devices tends to increase as the density of memory cells in the devices increases. However, there are exceptions to this rule—some ways of increasing memory cell density in a semiconductor memory device can actually have a negative impact on the device's performance.

For example, one way to increase the density of memory cells in a semiconductor memory device is by connecting a larger number of memory cells to each bit line in the device. As the number of memory cells connected to a bit line increases, loading resistance and load capacitance of the bit line tend to increase accordingly. Thus, the time it takes for charges to be transferred from each memory cell to the bitline in a read operation tends to increase, thus deteriorating the performance of the device.

Power consumption for a semiconductor memory device is a function of the voltage level required to read/write data from/to the device. Most contemporary semiconductor memory devices using complementary metal-oxide semiconductor (CMOS) transistors transfer data to/from memory cells at voltages that correspond to the working voltages of the constituent CMOS transistors. For example, CMOS transistor working voltages typically include both "high" and "low" voltages (e.g., VDD and VSS, respectively). Further, many contemporary semiconductor memory devices use so-called "full-swing data" techniques in conjunction with CMOS transistors to communicate data through various data transmission paths, such as a data read path and a data write path. This approach tends to decrease the overall operating speed of the memory device and increase both power consumption and chip size. Within the context at CMOS logic elements be variously defined, but is presently around about 1.2V for static random access memory (SRAM) devices, for example. Full swing signaling normally requires a data voltage swing at least equal to VDD, small swing signaling requires a data voltage less than VDD.

A great deal of effort has gone into the development of high performance memory devices having high density and yet operating with relatively low power consumption. Resulting contemporary devices include, for example, those described in U.S. Pat. Nos. 5,986,914 and 6,822,918, the subject matter of which is hereby incorporated by reference.

Nonetheless, these conventional devices suffer from a number of residual problems, particularly those associated with bit line structures, data read path, and data write path. Several of these apparent problems will now be described in some additional detail as background context to the inventive embodiments that follow.

Figure (FIG.) 1 is a graph illustrating load capacitance as a function of the number of memory cells connected to one bit line in an exemplary, conventional SRAM device. The load capacitance of a bit line, includes load capacitance related to a connected sense amplifier, column transmission (or "pass") circuitry, and other "residual" components associated with the bit line and peripheral circuits connected to the bit line.

Within the graph of FIG. 1, the total bit line load capacitance comprises a "YPATH" component indicating a portion of the load capacitance associated with the column transmission circuitry, and a "SenseAmp" component indicating a portion of the load capacitance associated with the associated sense amplifier. In operation, the column transmission circuitry receives a column address adapted to select and electrically connect a bit line with a sense amplifier, and generally comprises a plurality of column transmission gates.

As shown in FIG. 1, in a case where the number of memory cells connected to the bit line is 128, the residual load capacitance (i.e., the load capacitance above and beyond that associated with the sense amplifier and the column transmission circuitry) amounts to about 25%. However, the residual bit line load capacitance rises to 39% for 256 memory cells connected to the bit line, 54% for 512 connected memory cells, and 70% for 1024 connected memory cells. Of note, this trend increases for even more memory cells connected to the bit line.

Thus, if the number of memory cells connected to a single bit line is increased in order to increase the density of a semiconductor memory device, the resulting load capacitance will increase, thereby decreasing the operating speed of the device.

FIG. 2 is a schematic diagram illustrates an exemplary, conventional SRAM device having bit lines suffering from a large load capacitance.

With reference to FIG. 2, the structure includes word lines WL0, WL1, . . . , and WLn-1, a column decoder YDEC 20, column pass gates YPASS, 22 and 24, a plurality of memory cells MC, bit line pairs BLm-1, BLm-1B, BLm and BLmB and a sense amplifier 26.

In operation, word lines WL0, WL1, . . . , and WLn-1 are selected by a row decoder (not shown). Column decoder 20 receives a column address YA, and outputs a column selection signal as a decoded signal. Column pass gates 22 and 24 receive the column selection signal, and electrically connect a bit line pair connected to a memory cell MC designated by the column address YA, with sense amplifier 26.

Bit line pairs BLm-1, BLm-1B, BLm and BLmB transmit data from the connected plurality of memory cells MC, or transmit data to the memory cells MC. The plurality of memory cells MC are disposed and connected at intersections of the bit line pairs BLm-1, BLm-1B, BLm and BLmB and word lines WL0, WL1, . . . , and WLn-1.

Sense amplifier 26 senses and amplifies a signal output from a bit line selected by a column selection signal.

In general, an SRAM includes a plurality of "memory mats". Each memory mat may be divided into a plurality of sub memory mats, or "sub mats". Further, each sub mat may be divided into a plurality of memory "blocks". Each memory block typically includes a plurality of sense amplifiers that are divided and disposed in relation to an input/output(I/O) port. Each sense amplifier is shared by bit line pairs, the number of which corresponds to the number of column bits within each memory block.

In one embodiment, for example, the number of column bits within each memory block is assumed to be 32, and the number of I/O ports is 9. Thus, each sense amplifier is shared by 32 bit line pairs and is adapted to an I/O port. Column pass gates 22 and 24 are allocated across a bit line pair to receive the column selection signal and electrically connect the corresponding bit line pair with a sense amplifier.

Assuming the number of column bits within each memory block of an exemplary SRAM is 32 and the number of I/O ports is 9, sense amplifier 26 will be shared by 32 bit line pairs, and the number of column pass gates YPASS associated with bit line pairs is also 32. (This will change to 64, for example, if the number of row bits assumed for each memory block were 64, for example).

Within this exemplary context, efforts have been made to reduce the number of memory cells connected to each bit line within each memory block in order to avoid overly high load capacitances that adversely effect data transmission speed in a constituent memory device. One exemplary method in this regard is described in relation to FIG. 3.

FIG. 3 is a schematic diagram illustrating operation of an exemplary, conventional SRAM having reduced load capacitance per bit line.

With reference to FIG. 3, two bit line pairs BLm-1, BLm-1B, BLm, BLmB are shown. The two bit line pairs BLm-1, BLm-1B, BLm, BLmB receive a column selection signal output from a column decoder YDEC 30 within one memory block of an SRAM, and so are selectively connected to sense amplifier 36 through respective column pass gates YPASS 32 and 34.

In comparing the bit line structure of FIG. 3 with the former conventional structure shown in FIG. 2, the memory cells of GIG. 3 connected to one bit line pair are divided into two groups and are controlled separately.

In other words, the "divided bit line structure" illustrated effectively reduces the load capacitance per bit line pair by essentially reducing the number of memory cells connected to the bit line. The memory cells are divided into two groups and each group is separately controlled by a control signal applied to a selection line SL1, SL2.

This method of separately and individually, controlling the divided bit lines will now be described in some additional detail, in the context of an example that assumes that an accessing memory cell MC is connected to an upper bit line pair.

In an example of one bit line pair BLm-1, BLm-1B, the bit line pair BLm-1, BLm-1B is switched and individually, independently, controlled by switching transistors NM31, NM32, NM33 and NM34. When a control signal applied to a control line SL1 is high and a control signal SL2 applied to a control line SL2 is low, a node N31 is high, and a node N32 is low, thus the switching transistors NM31 and NM32 are turned ON, and the switching transistors NM33 and NM34 are turned OFF.

Relative to bit line pair BLm-1, BLm-1B, the bit line in an upper part of switching transistors NM31 and NM32 is called an "upper bit line pair," and the bit line in a lower part of switching transistors NM33 and NM34 is called a "lower bit line pair."

The upper bit line pair is electrically connected to a global bit line pair GBLm-1, GBLm-1B, and the lower bit line pair is electrically disconnected from the global bit line pair GBLm-1, GBLm-1B. The global bit line pair GBLm-1, GBLm-1B is electrically connected to sense amplifier 36 through column pass gate 32. Sense amplifier 36 senses, amplifies and outputs data received from the global bit line pair GBLm-1, GBLm-1B.

On the contrary, when an accessing memory cell MC is connected to the lower bit line pair, a control signal applied to selection line SL1 is low, and a control signal applied to selection line SL2 is high.

Thus, the lower bit line pair is connected to the global bit line pair GBLm-1, GBLm-1B, and the global bit line pair GBLm-1, GBLm-1B is electrically connected to sense amplifier 36 through column pass gate 32. Sense amplifier 36 senses, amplifies, and outputs data received from the global bit line pair GBLm-1, GBLm-1B.

Thus, one conventional approach to addressing the problem of high bit line load capacitance results in the provision of a memory device, like the one illustrated in FIG. 3, including global bit line pairs GBLm-1, GBLm-1B, GBLm, GBLmB, switching transistors NM31, NM32, NM33, NM34, NM35, NM36, NM37 and NM38, and selection lines SL1, SL2.

This reduction in overall load capacitance is the result of reduced residual bit line capacitance. Yet, the portion of bit line load capacitance associated with column transmission circuitry (e.g., column pass gates 22 and 24) remains unchanged by the foregoing solution illustrated in FIG. 3.

FIG. 4 is a circuit diagram further illustrating in some additional detail an exemplary column pass gate YPASS, such as those used in conjunction with the circuits shown in FIGS. 2 and 3.

The typical column pass gate YPASS receives read/write information RCON and a column address YA, and selects a bit line pair connected to an accessing memory cell to discriminate a data read path from a data write path. The column pass gate YPASS also receives a column selection signal Yai.

In a data read operation applied to the column indicated by the column selection signal Yai, the column selection signal Yai and the read/write information RCON go high. As a result, a bit line pair BL, BLB and a read line pair LRSDL, LRSDLB are connected electrically.

In a data write operation, only the column selection signal Yai goes high. As a result, the bit line pair BL, BLB and a write line pair LWSDL, LWSDLB are connected electrically.

FIG. 5 is a block diagram schematically illustrating exemplary sub mats in an SRAM and adapted to provide a conventional data read path. Each sub mat includes a plurality of memory blocks. A first sub mat SMAT1 includes a plurality of memory blocks BLK1~BLK8, and a second sub mat SMAT2 includes a plurality of memory blocks BLK11~BLK18.

Each of the plurality of memory blocks BLK1~BLK8, and BLK11~BLK18 includes a first sense amplifier BSA1 and a second sense amplifier BSA2. FIG. 5 illustrates only one first-sense amplifier BSA1 and one second-sense amplifier BSA2, but a plurality of first sense amplifiers BSA1 and a plurality of second sense amplifiers BSA2 are actually allocated and disposed per I/O port. Thus, within each memory block, the number of I/O ports is equal to the number of the first sense amplifiers BSA1 and to the number of the second sense amplifiers BSA2.

Each of the first sense amplifiers BSA1 senses and amplifies data represented on a bit line selected by an address, and each of the second sense amplifiers BSA2 senses and amplifies data output from each of the first sense amplifiers BSA1.

The second sense amplifiers BSA2 significantly reduce the amount of time required to output a full-swing data at contemporary CMOS levels and/or to provide output data at a well stabilized level. Thus, to increase the speed of a data read operation and/or output data at a well stabilized level, sense amplifiers of several groups are generally used in a conventional SRAM.

Still referring to FIG. 5, main data lines MDL0 and MDL1 transmit data output from the second sense amplifiers BSA2.

The data transmitted through the main data lines MDL0 and MDL1 is applied to a logical NAND gate NAND51, and NANDed before being output to a data output terminal through an output driver (not shown). The main data lines MDL0 and MDL1 are precharged to high during a read operation. Thus, when any one of the main data lines MDL0 and MDL1 goes low, the NAND gate NAND51 outputs a high, and as such, it may be regarded as performing a logical sum operation.

FIG. 6 is a circuit diagram illustrating in some additional detail a data read path for one I/O port within two blocks BLK1 and BLK11 of FIG. 5.

As shown in FIG. 6, a first sense amplifier BSA1, 52 and a second sense amplifier BSA2, 54 are included within one memory block BLK1, and a first sense amplifier BSA1, 56 and a second sense amplifier BSA2, 58 are included in another memory block BLK11.

One bit line pair within the memory block BLK1 is selected by a column address, and data represented in the bit line pair is transmitted to a local section data line pair LSDL, LSDLB. One first-sense amplifier 52 within the memory block BLK1 is enabled by a sense amplifier enable signal BSA1_EN, and primarily senses and amplifies data represented on the local section data line pair LSDL, LSDLB.

Second sense amplifier 54 is enabled by a sense amplifier enable signal BSA2_EN, and secondarily senses and amplifies data output from the first sense amplifier 52. The data output by the second sense amplifier BSA2 is transmitted by the main data line MDL0.

The structure and operation of first sense amplifiers 52 and 56 and second sense amplifiers 54 and 58 are conventionally understood and will not be described in any further detail.

As shown in FIGS. 5 and 6, the number of main data lines as an input terminal of the NAND gate NAND51 is equal to the number of sub mats. The NAND gate NAND51 performs a logical NAND operation for signals input from a plurality of main data lines MDL0 and MDL1.

That is, an exemplary SRAM having the data read path produces a lot of signal delay based on the logical NAND operation, thus lowering its operating speed. First and second sense amplifiers are used for every memory block, thus increasing the chip size of the exemplary SRAM and its power consumption during a read operation.

FIG. 7 is a block diagram schematically illustrating one I/O port for an exemplary SRAM and adapted to provide a conventional data write path.

Referring to FIG. 7, when data is input to a write driver unit WDRV 76, the data is transmitted to a data input line pair DIL, DILB. The data of the data input line pair DIL, DILB is transmitted to a local data input line pair LDIL, LDILB. A column pass gate YPASS 74 receiving a column selection signal output from a column decoder YDEC 70 electrically connects a selected bit line pair BL, BLB with a local data input line pair LDIL, LDILB. Then, the data transmitted to the bit line pair BL, BLB is written to a memory cell selected by an address.

In the data write path, the write driver unit 76 outputs full-swing data at CMOS levels when the data is applied. The full-swing data at CMOS levels is applied to the data input line pair DIL, DILB and the local data input line pair LDIL, LDILB, resulting in higher power consumption and reduced operating speed for the write operation.

Thus it is essentially required to improve a structure of the bit line, and associated data read and data write paths, etc., to realize a semiconductor memory device truly capable of operating at reduced power consumption, but increased operating speed at higher densities.

SUMMARY OF THE INVENTION

Accordingly, exemplary embodiments of the invention provide a semiconductor memory device comprising a hierarchical bit line structure adapted to address the problem of reduced operating speed caused by increased bit line loading by connected peripheral circuits. For example, in one embodiment of the invention, a semiconductor memory device having a substantially reduced number of column pass gates is provided. This type of device has a markedly reduced chip size.

In exemplary embodiments of the invention, a semiconductor memory device is provided having a data read path and a write data path capable of operating with reduced power consumption. Thus, operation speed may be increased.

In exemplary embodiments of the invention, a semiconductor memory device is provided that is capable of substantially reducing operational errors by transmitting a small swing data to a data input line pair during a data write operation.

Thus, in one embodiment, the invention provides a semiconductor memory device, comprising; first and second memory cell clusters sharing a first bit line pair, third and fourth memory cell clusters connected respectively to word lines coupled to the first and second memory cell clusters, and sharing a second bit line pair different from the first bit linepair, and a column pass gate adapted to switch one of the first and second bit line pairs to a common sense amplifier in response to a column selection signal.

In another embodiment, the invention provides a semiconductor memory device having a plurality of bit line pairs, each bit line pair connecting a plurality of memory cells that are operationally divided into first and second memory cell clusters, the memory device comprising; a plurality of global bit line pairs, each one disposed in relation to at least two of the plurality of bit line pairs, a cluster selecting unit adapted to access one of the first and second memory cell clusters, wherein each of the first and second memory cell clusters is connected to bit line pairs corresponding to one of the global bit line pairs, and a plurality of column pass gates, each being disposed in relation to a global bit line, adapted to receive a column selection signal, and further adapted to connect the global bit line pair to a common sense amplifier.

In another embodiment, the invention provides a semiconductor memory device, comprising; a plurality of memory blocks, each comprising a plurality of bit line pairs, first sense amplifiers, allocated and disposed in relation to respective Input/Output (I/O) ports within the memory blocks, and adapted to sense data on one of the plurality of bit line pairs, as selected by an address and amplify the data to a first level, and second sense amplifiers, each associated with at least one of the first sense amplifiers and adapted to sense data represented on read section data line pairs associated with the first sense amplifiers and amplify the data to a second level higher than the first level.

In another embodiment, the invention provides a semiconductor memory device having a plurality of memory blocks, in each of which a plurality of bit line pairs connected to at least one memory cell are disposed, the device comprising; a first local sense amplifier for sensing data of a bit line pair connected to a selected memory cell within a first memory block and for amplifying the data to a first level, a second local sense amplifier for sensing data of a bit line pair connected to a memory cell selected within a second memory block that is disposed in the same direction as a first direction of the first memory block, and amplifying the data to the first level, and a global sense amplifier for sensing an output signal from any one of the first and second local sense amplifiers, and amplifying the signal to a second level higher than the first level.

In another embodiment, the invention provides a semiconductor memory device, comprising a write driving circuit for receiving data and writing the data to a memory cell, the write driving circuit comprising a first write driver unit for driving the data to a level lower than a level of the data to be written to the memory cell, and outputting the data to a first data input line pair, and a second write driver unit for receiving the data from the first write driver unit, and driving the data to a level of data to be written to the memory cell, and providing the data to a selection bit line pair connected to the memory cell.

In another embodiment, the invention provides a semiconductor memory device having a plurality of memory blocks, the device comprising; a data read path, in which data of a bit line pair selected within any one of the memory blocks is sensed by a local sense amplifier and is amplified to data of a first level, and in which output data of the local sense amplifier is sensed by a global sense amplifier shared by a local sense amplifier within another one or more memory blocks, and is amplified to data of a second level higher than the first level, and a data write path, in which a first write driver unit receives write data, drives the data to a level lower than a level of data to be written to a memory cell, and outputs the data to a first data input line pair, and in which a second write driver unit receives data from the first write driver unit, drives the data to a level of data to be written to the memory cell, and provides the data to a selection bit line pair connected to the memory cell.

DESCRIPTION OF EXEMPLARY EMBODIMENTS

Hereinafter, exemplary embodiments of the invention will be described with reference to FIGS. 8 through 20. It is, however, understood that the invention may be variously embodied and is not limited to only the illustrated embodiments.

Referring to FIGS. 8 to 11, various embodiments of a semiconductor memory device having a hierarchical bit line structure will be described.

Figure 8:
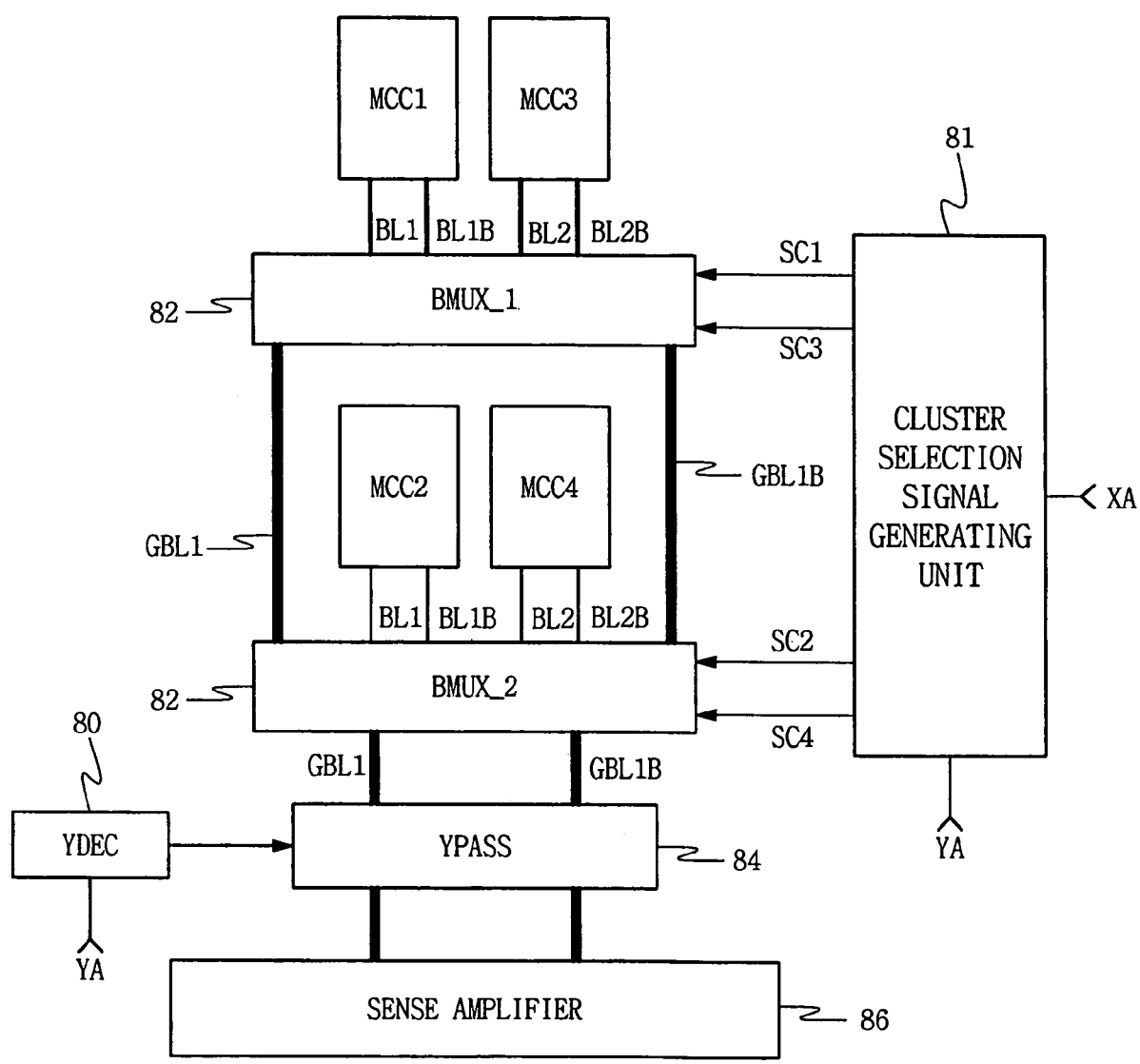
FIG. 8 is a block diagram illustrating a semiconductor memory device having a hierarchical bit line structure according to a first exemplary embodiment of the invention.

For example, FIG. 8 is a block diagram of a semiconductor memory device having a hierarchical bit line structure according to a first exemplary embodiment of the invention.

In FIG. 8, a semiconductor memory device according to a first exemplary embodiment includes first to fourth memory cell clusters MCC1, MCC2, MCC3 and MCC4 divided operationally, and a column pass gate YPASS 84 for performing a switching in response to a column selection signal.

Memory cells constituting the first to fourth memory cell clusters MCC1, MCC2, MCC3 and MCC4 may be static type memory cells.

The first and second memory cell clusters MCC1 and MCC2 share one bit line pair BL1, BL1B, and are divided operationally by a cluster selecting unit 82.

The third and fourth memory cell clusters MCC3 and MCC4 share a bit line pair BL2, BL2B different from the bit line pair BL1, BL1B, and are divided operationally by the cluster selecting unit 82.

The third and fourth memory cell clusters MCC3 and MCC4 are individually connected corresponding to word lines connected with the first and second memory cell clusters MCC1 and MCC2. That is, the third memory cell cluster MCC3 is connected to a word line connected to the first memory cell cluster MCC1, and the fourth memory cell cluster MCC4 is connected to a word line connected to the second memory cell cluster MCC2.

The column pass gate 84 performs the switching for one of bit line pairs connected with one of the first to fourth memory cell clusters MCC1, MCC2, MCC3 and MCC4, to a common sense amplifier 86, in response to a column selection signal output from a column decoder YDEC 80.

The cluster selecting unit BMUX_1, BMUX_2, 82 is controlled by a cluster selection signal SC1, SC2, SC3, SC4. The cluster selecting unit 82 receives the cluster selection signal SC1, SC2, SC3, SC4, and selects one of the first to fourth memory cell clusters MCC1, MCC2, MCC3, MCC4.

The cluster selection signal SC1, SC2, SC3, SC4 is generated by a cluster selection signal generating unit 81.

Figure 10:
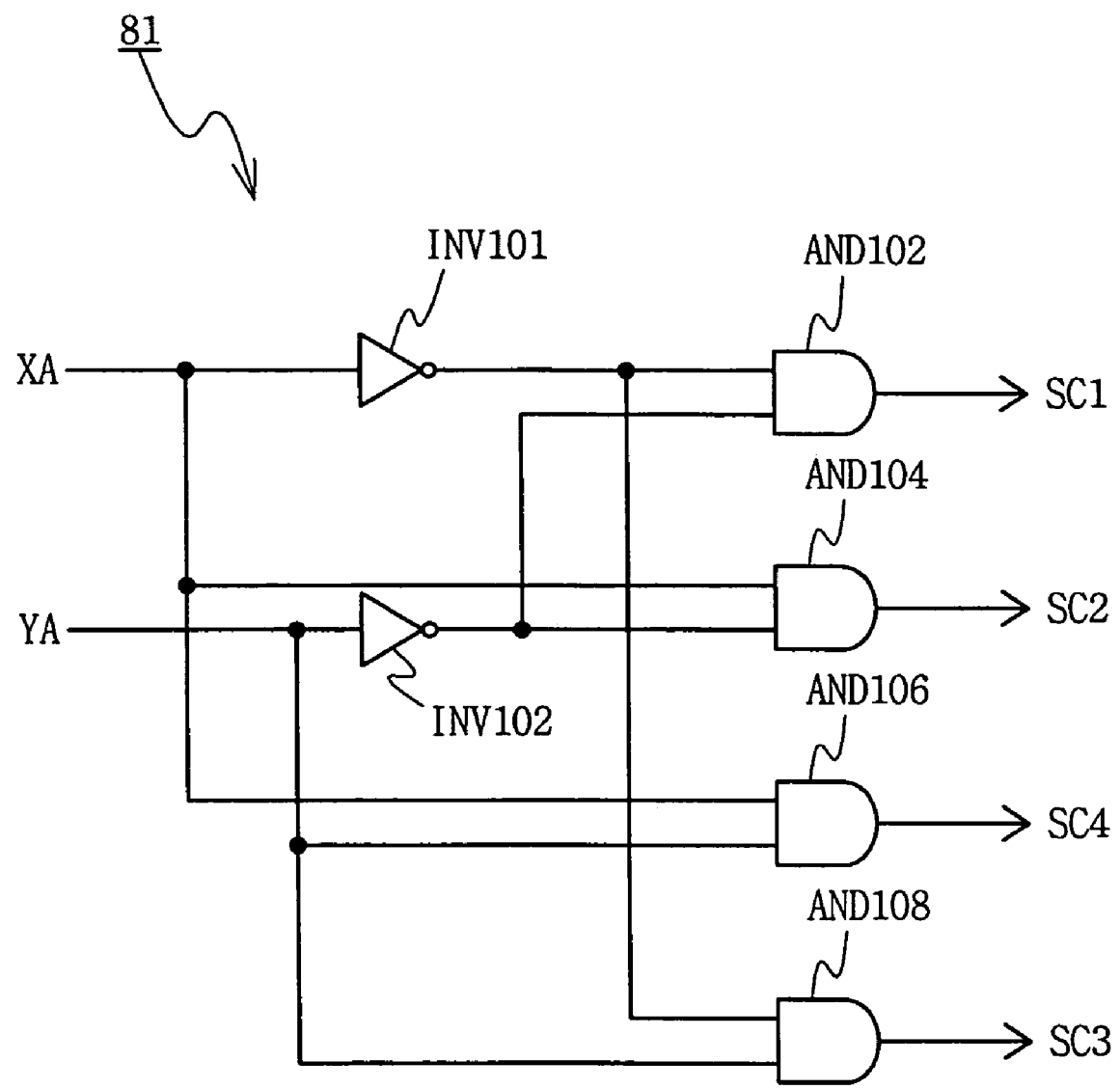
FIG. 10 is a block diagram illustrating an example of cluster selection signal generating unit of FIG. 8.

The cluster selection signal generating unit 81 performs a logical operation of column address YA and row address XA, and generates the cluster selection signal SC1, SC2, SC3, SC4. One example for the cluster selection signal generating unit 81 is shown in FIG. 10, and will be described more in detail, as follows.

Figure 9:
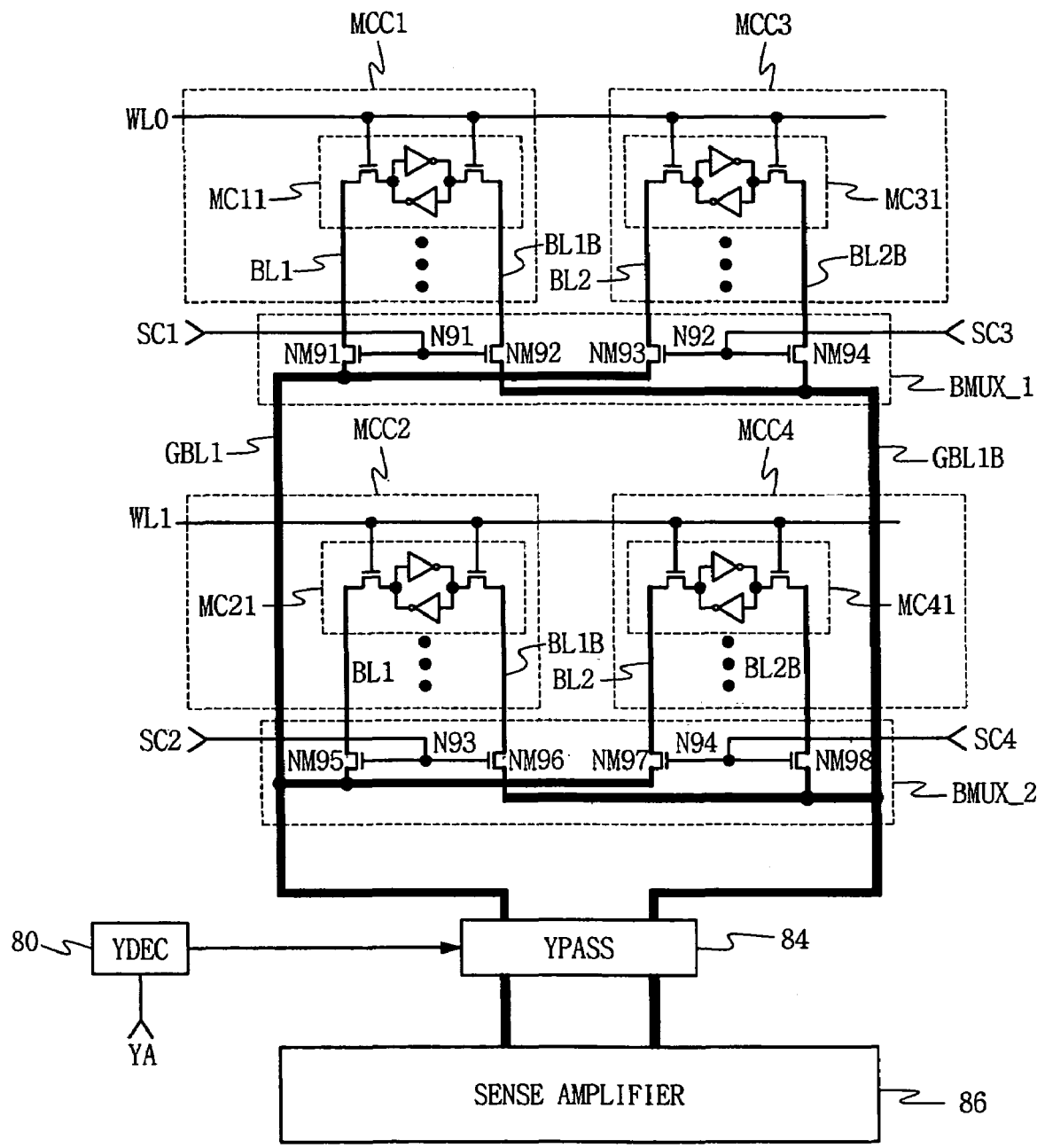
FIG. 9 is a detailed circuit diagram of FIG. 8.

FIG. 9 further illustrates the circuit of FIG. 8. In the context of this illustrated description, a read data operation is assumed as being applied to a memory cell MC11 connected to a word line WL0, among memory cells within first memory cell cluster MCC1.

First, the word line WL0 is enabled by a row address indicating the word line WL0.

When a column address YA indicating a bit line pair BL1, BL1B connected to the memory cell MC11 is applied, a column decoder YDEC receives the column address YA, and generates a column selection signal.

The column pass gate YPASS 84 receives the column selection signal, and electrically connects a global bit line pair GBL1, GBL1B with a common sense amplifier 86. The global bit line pair GBL1, GBL1B is shared by the bit line pair BL1, BL1B and the bit line pair BL2, BL2B. Through the global bit line pair GBL1, GBL1B, data of memory cell within any one of the first to fourth memory cell clusters MCC1, MCC2, MCC3 and MCC4 is transmitted to the common sense amplifier 86.

The global bit line pair GBL1, GBL1B electrically connected to the common sense amplifier 86 through the column pass gate 84 is electrically connected to a bit line pair BL1, BL1B that is connected to a first memory cell cluster MCC1 through the cluster selecting unit BMUX_1, BMUX2. At this time, the rest memory cell clusters MCC2, MCC3 and MCC4 except the first memory cell cluster MCC1 are disconnected from the global bit line pair GBL1, GBL1B.

The cluster selecting unit BMUX1, BMUX2 includes gate transistors NM91, NM92, NM93, NM94, NM95, NM96, NM97, NM98 controlled by the cluster selection signals SC1, SC2, SC3, SC4. The cluster selecting unit BMUX1, BMUX2 operates so that any one of the first to fourth memory cell clusters MCC1, MCC2, MCC3 and MCC4 is accessed. The gate transistors NM91, NM92, NM93, NM94, NM95, NM96, NM97 and NM98 control an electrical connection between each of the bit line pairs BL1, BL1B, BL2 and BL2B and its corresponding global bit line pair GBL1, GBL1B.

For example, when the cluster selection signal SC1 is high and the rest cluster selection signals SC2, SC3 and SC4 are low, data of the memory cell MC11 is transmitted by the global bit line pair GBL1, GBL1B. The data is sensed and amplified by the common sense amplifier 86.

The gate transistors NM91, NM92, NM93, NM94, NM95, NM96, NM97 and NM98 may be NMOS transistors, or PMOS (P-type Metal Oxide Semiconductor) transistors.

With reference to FIGS. 8 and 9, the exemplary semiconductor memory device will be further described in view of the common sense amplifier 86.

Each of a plurality of bit line pairs BL1, BL1B, BL2 and BL2B is connected with a plurality of memory cells MC11, MC21, MC31 and MC41.

The plurality of memory cells MC11, MC21, MC31 and MC41 are operationally divided into first and second memory cell clusters. That is, memory cells connected to the bit line pair BL1, BL1B are operationally divided into a first memory cell cluster MCC1 and a second memory cell cluster MCC2, and memory cells connected to the bit line pair BL2, BL2B are operationally divided into a first memory cell cluster MCC3 and a second memory cell cluster MCC4.

The first memory cell cluster MCC3 connected to the bit line pair BL2, BL2B is called a third memory cell cluster MCC3, for a distinction from the first memory cell cluster MCC1 connected to the bit line pair BL1, BL1B. The second memory cell cluster MCC4 connected to the bit line pair BL2, BL2B is called a fourth memory cell cluster MCC4 for a distinction from the first memory cell cluster MCC1 connected to the bit line pair BL1, BL1B.

Each one of the plurality of global bit line pairs is disposed corresponding to every at least two bit line pairs. Though the global bit line pair was shown only for GBL1, GBL1B in FIGS. 8 and 9, the global bit line pairs can be adapted corresponding to the number of column bit number/2 per I/O port within a memory block. For example, a global bit line pair GBL1, GBL1B corresponds to two bit line pairs BL1, BL1B, BL2, BL2B.

The cluster selecting unit 82 operates so that one of the first and second memory cell clusters connected with bit line pairs corresponding to one of the global bit line pairs is accessed. For example, the cluster selecting unit 82 operates so that one of the first to fourth memory cell clusters MCC1, MCC2, MCC3 and MCC4 connected with bit line pairs BL1, BL1B, BL2 and BL2B corresponding to global bit line pair GBL1, GBL1B is accessed.

The column pass gate is disposed corresponding to every the global bit line pair. The column pass gates receive a column selection signal and electrically connect one global bit line pair corresponding to the column selection signal with a common sense amplifier.

Beneficially the global bit line pairs may be formed of a metal line having a low specific resistance.

FIG. 10 is a block diagram further illustrating an example of cluster selection signal generating unit 81 of FIG. 8.

Referring to FIG. 10, when a row address XA and a column address YA are low, only a cluster selection signal SC1 goes high. When the row address XA is high and the column address YA is low, only a cluster selection signal SC2 goes high. When the row address XA is low and the column address YA is high, only a cluster selection signal SC3 goes high. When the row address XA and the column address YA are high, only a cluster selection signal SC4 goes high.

With reference to FIGS. 9 and 10, in reading data of memory cell within a first memory cell cluster MCC1, the row address XA and the column address YA are low.

In reading data of memory cell within a second memory cell cluster MCC2, the row address XA is high and the column address YA is low.

In reading data of memory cell within a third memory cell cluster MCC3, the row address XA is low and the column address YA is high.

In reading data of memory cell within a fourth memory cell cluster MCC4, the row address XA and the column address YA are high.

As described above, a semiconductor memory device according to the first exemplary embodiment includes first and second memory cell clusters that share the same bit line pair and that are divided operationally, and third and fourth memory cell clusters that share a bit line pair different from the bit line pair of the first and second memory cell clusters and that are divided operationally. Bit line pairs connected with the first to fourth memory cell clusters are selectively switched to a common sense amplifier through one column pass gate.

Accordingly the semiconductor memory device according to the first exemplary embodiment reduces a loading capacitance of bit line, increases an operating speed and provides an improved density.

Figure 11:
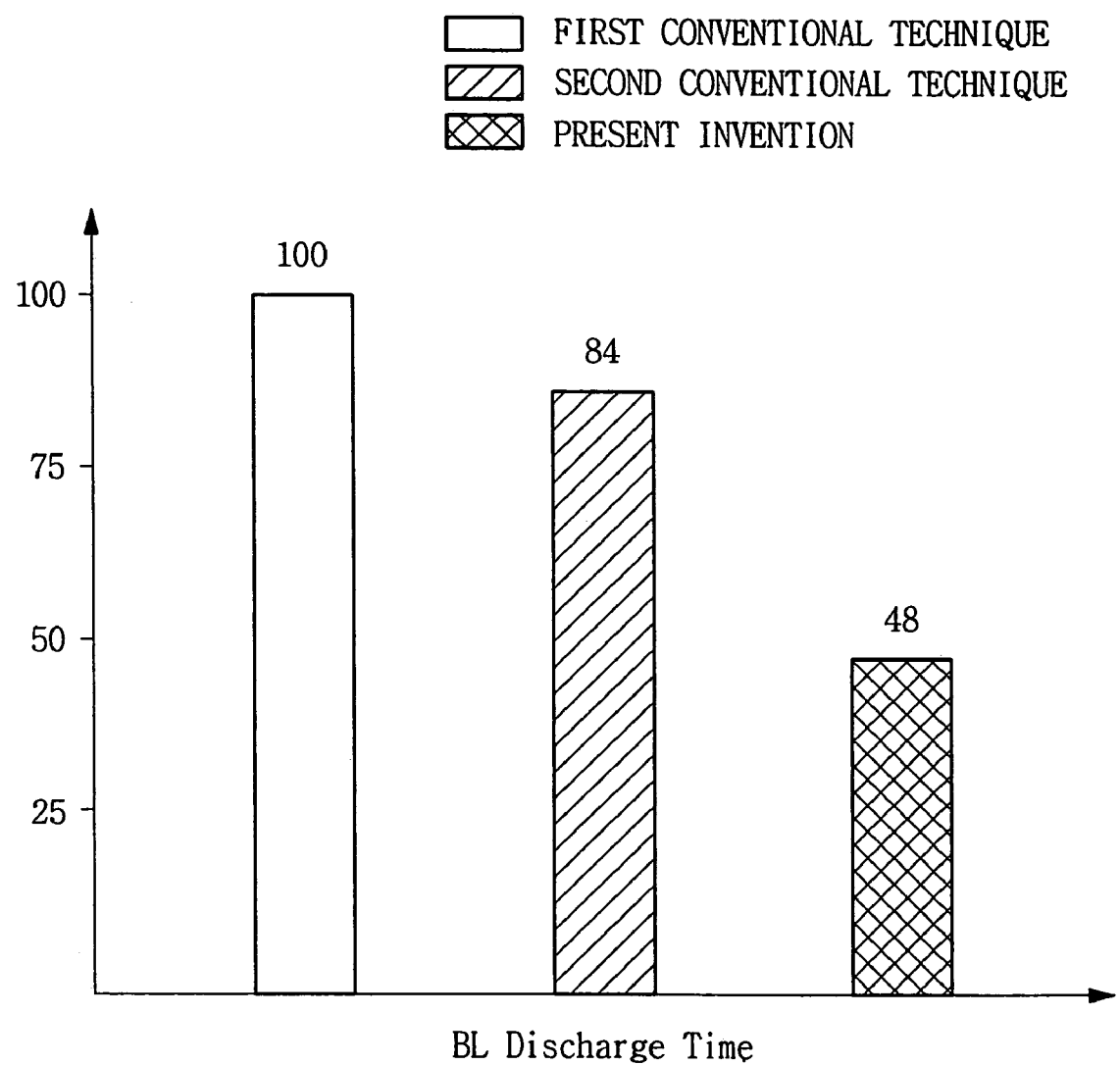
FIG. 11 is a graph of comparing a semiconductor memory device according to a first exemplary embodiment of the invention with a conventional technique, in view of effect.

FIG. 11 is a graph of comparing, in view of effect, the semiconductor memory device according to the first exemplary embodiment of the invention with a conventional technique.

FIG. 11 distinctly illustrates bit line discharge times of first and second conventional techniques, and of the invention.

The bit line discharge time is time taken while memory cells discharge charge to the bit line, and is closely related to a load capacitance of bit line.

Figure 1:
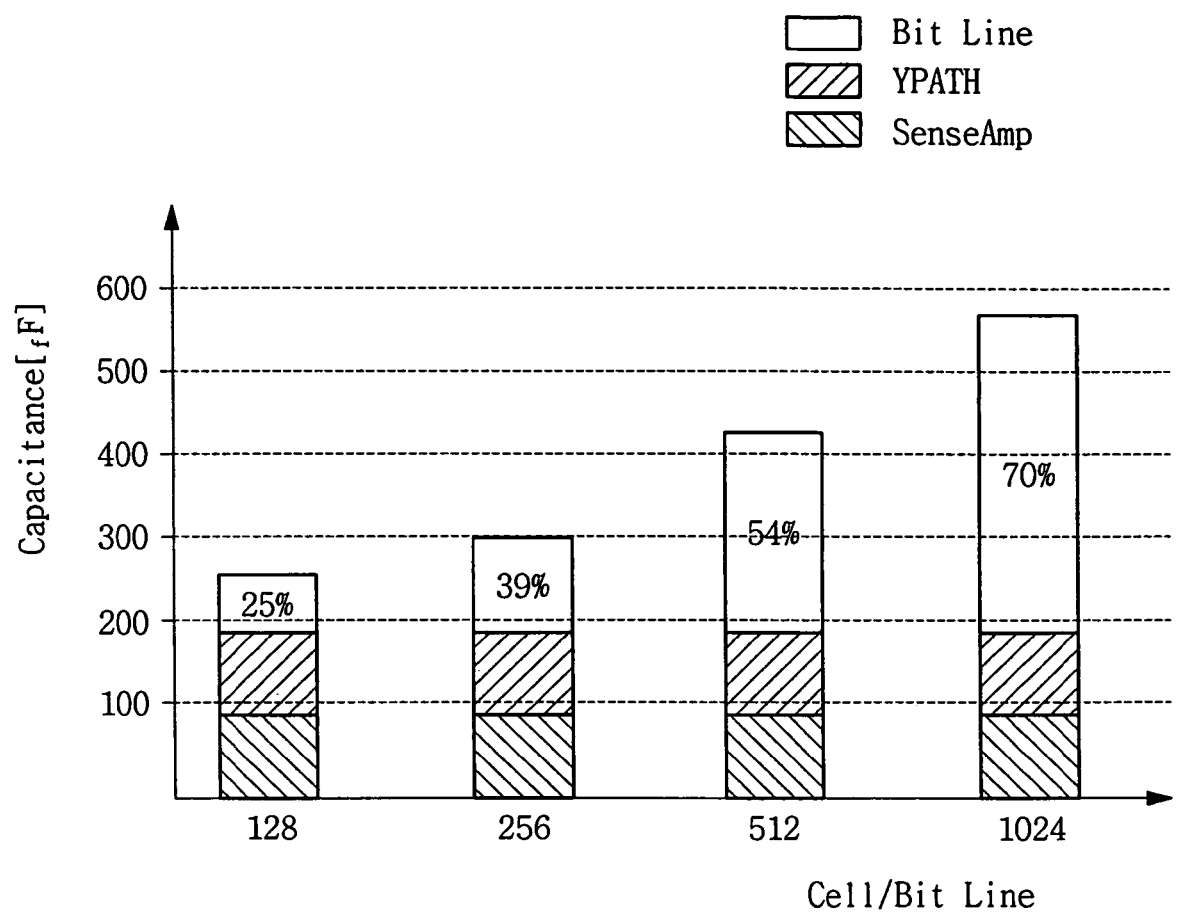
FIG. 1 is a graph illustrating a load capacitance based on the number of memory cells connected to one bit line in an SRAM according to a prior art.
Figure 2:
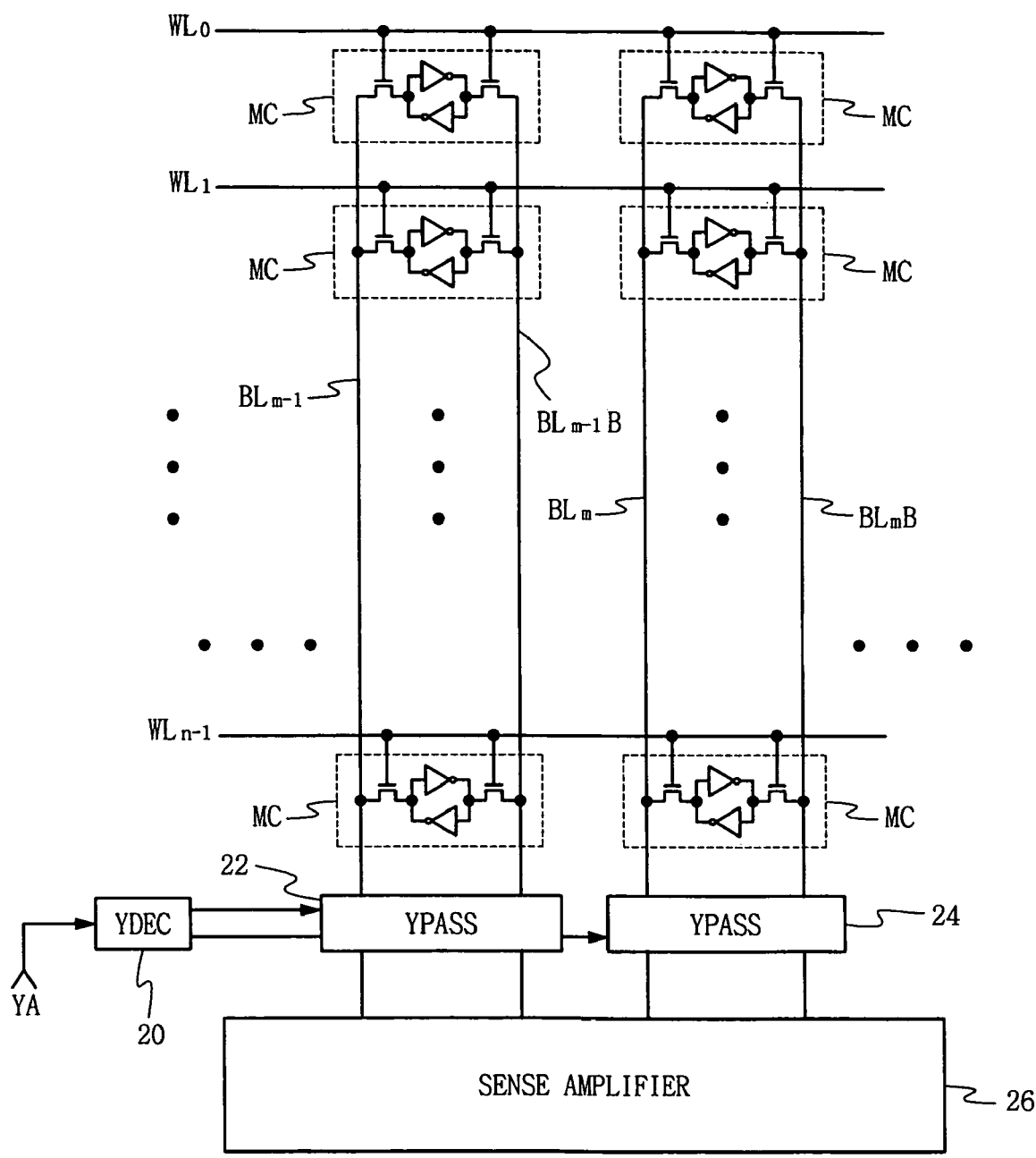
FIG. 2 is a schematic diagram illustrating a bit line structure having a large load capacitance of bit line in an SRAM according to a prior art.
Figure 3:
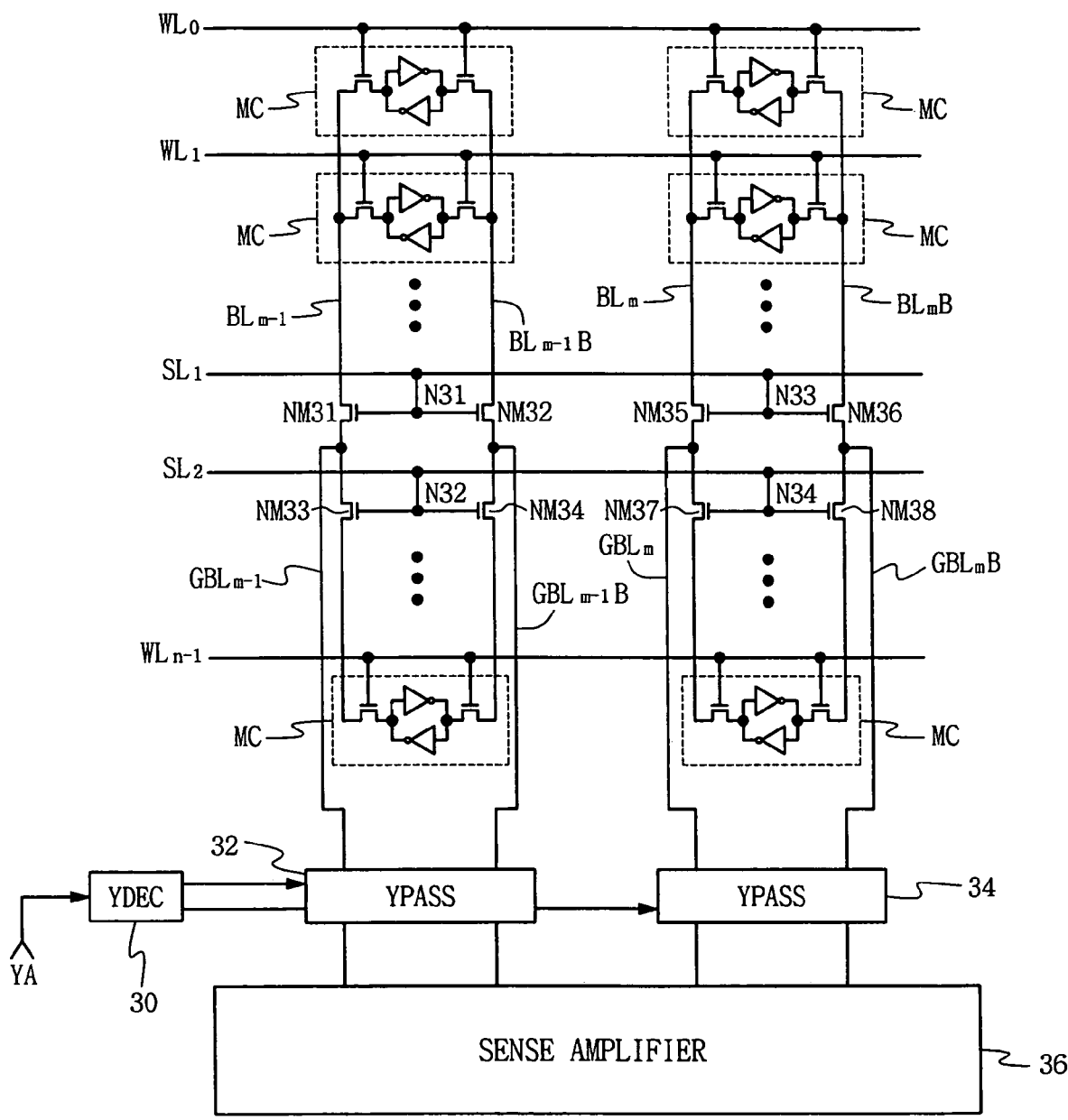
FIG. 3 is a schematic diagram illustrating an example of SRAM to reduce a load capacitance of bit line according to a prior art.
Figure 4:
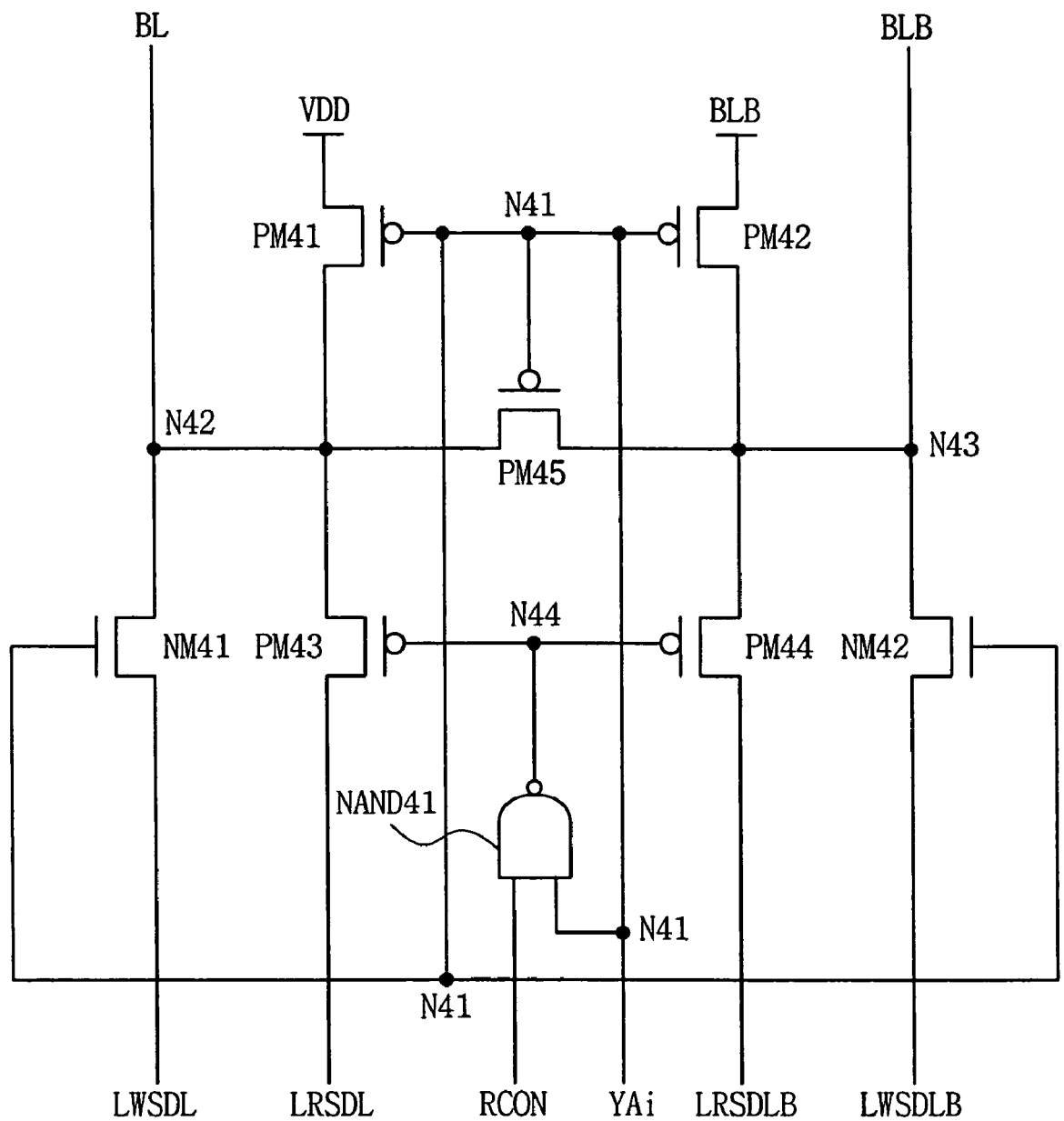
FIG. 4 is a circuit diagram illustrating in detail an example of column selecting unit shown in FIGS. 2 and 3.

The first conventional technique is for the semiconductor memory device shown in FIG. 2, and the second conventional technique is for the semiconductor memory device shown in FIG. 3.

In assuming that the discharge time of bit line in the first conventional technique is 100%, bit line discharge time of the second conventional technique having a bit line structure that it is divided into an upper bit line and a lower bit line, is about 84%, and bit line discharge time of a semiconductor memory device according to a first exemplary embodiment of the invention is about 48%.

That is, in the invention, memory cells are operationally divided as a unit of memory cell cluster, and more than half in the number of column pass gates is reduced as compared with the second conventional technique, thus a load capacitance from the peripheral circuit of bit line is substantially reduced.

Subsequently, referring to FIGS. 12 to 15, a semiconductor memory device according to a second exemplary embodiment of the invention will be described as follows.

Figure 12:
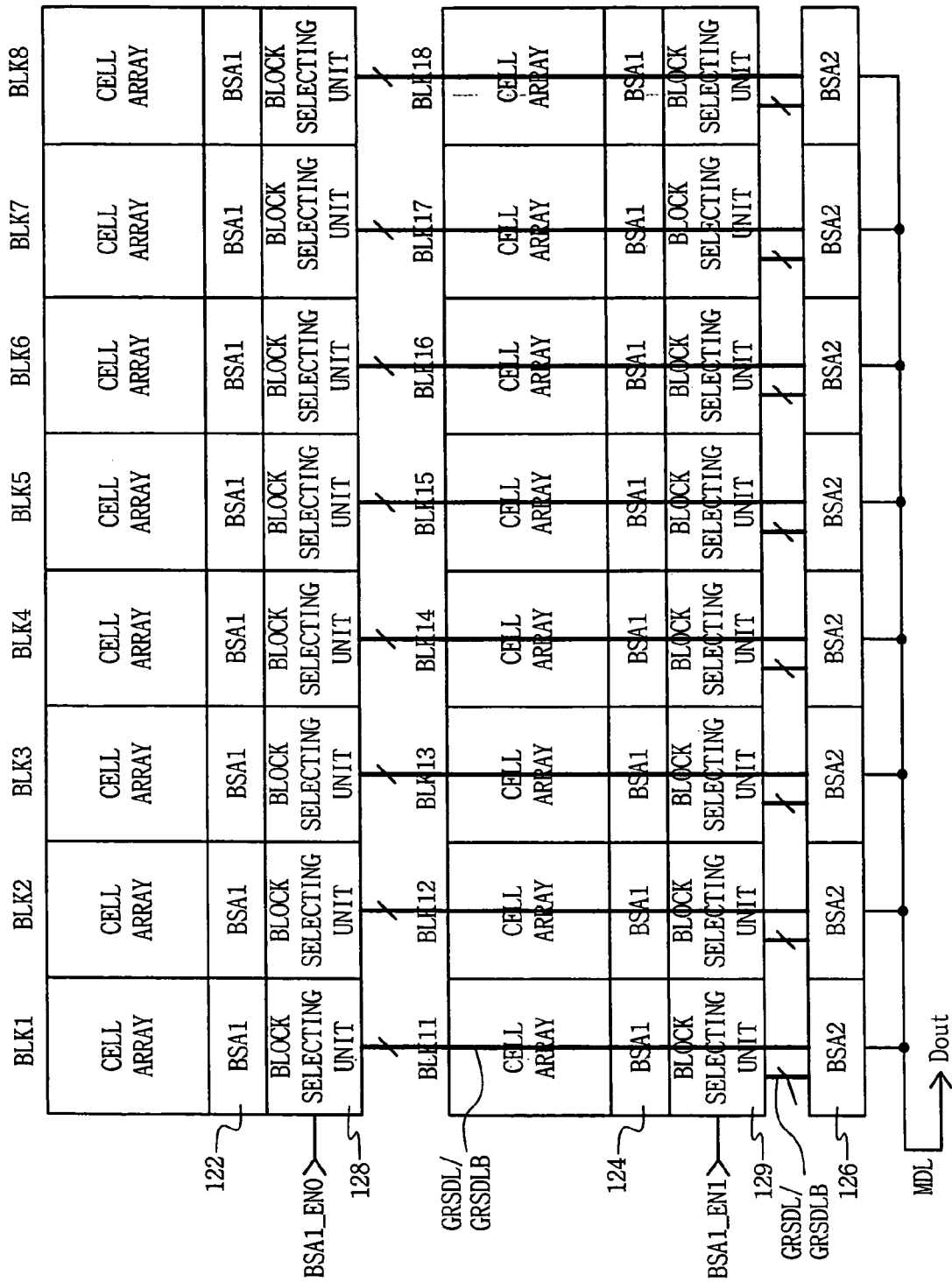
FIG. 12 is a block diagram illustrating a semiconductor memory device according to a second exemplary embodiment of the invention.

FIG. 12 is a block diagram illustrating a semiconductor memory device according to a second exemplary embodiment of the invention.

As shown in FIG. 12, the semiconductor memory device according to a second exemplary embodiment includes a plurality of memory blocks BLK1~BLK8 and BLK11~BLK18, first sense amplifiers BSA1 and second sense amplifiers BSA2. Before the first sense amplifier BSA1 in the respective memory blocks BLK1~BLK8 and BLK11~BLK18, a column pass gate is actually disposed, but this has not a close relation to the present invention, and so it is not shown in the drawing.

The semiconductor memory device may be an SRAM of which memory cells within the memory blocks BLK1~BLK8, and BLK11~BLK18 are static type.

The memory blocks BLK1~BLK8 and BLK11~BLK18 individually includes a plurality of bit line pairs (not shown) connected with a plurality of memory cells (not shown).

The first sense amplifiers BSA1 sense data represented on one bit line pair selected by an address, from the plurality of bit line pairs, and amplifies the data to a first level. The first sense amplifiers BSA1 may be allocated and disposed per I/O port within respective memory blocks.

Each one of the second sense amplifiers BSA2 is disposed every one read section data line pair GRSDL, GRSDLB, and senses data represented on a read section data line pair LRSDL, LRSDLB of first sense amplifier BSA1 connected to memory blocks disposed in the same direction of first direction among the first sense amplifiers BSA1.

The first direction may be a column direction. In other words, as shown in FIG. 12, the memory blocks disposed in the same direction of first direction may be a memory block BLK1 and a memory block BLK11, and a memory block BLK2 and a memory block BLK12, etc.

An electrical connection of the read section data line pairs GRSDL, GRSDLB, and at least two mutually different first-sense amplifiers BSA1 corresponding to each read section data line pair GRSDL, GRSDLB, is controlled by corresponding block selecting units.

For example, an electrical connection of two mutually different first-sense amplifiers 122 and 124, and the read section data line pairs GRSDL and GRSDLB, is connected by block selecting units 128 and 129.

The block selecting units receive block selection signals BSA1_EN0 and BSA1_EN1, and control an electrical connection between the read section data line pairs GRSDL, GRSDLB and its corresponding two mutually different first-sense amplifiers BSA1.

For example, if the first direction is a column direction, the block selection signals BSA1_EN0 and BSA1_EN1 may be row address information, which is why memory blocks disposed in the column direction, e.g., BLK1 and BLK11, and BLK2 and BLK12 etc., can be distinguished by a row address to select a word line within each memory block.

Figure 5:
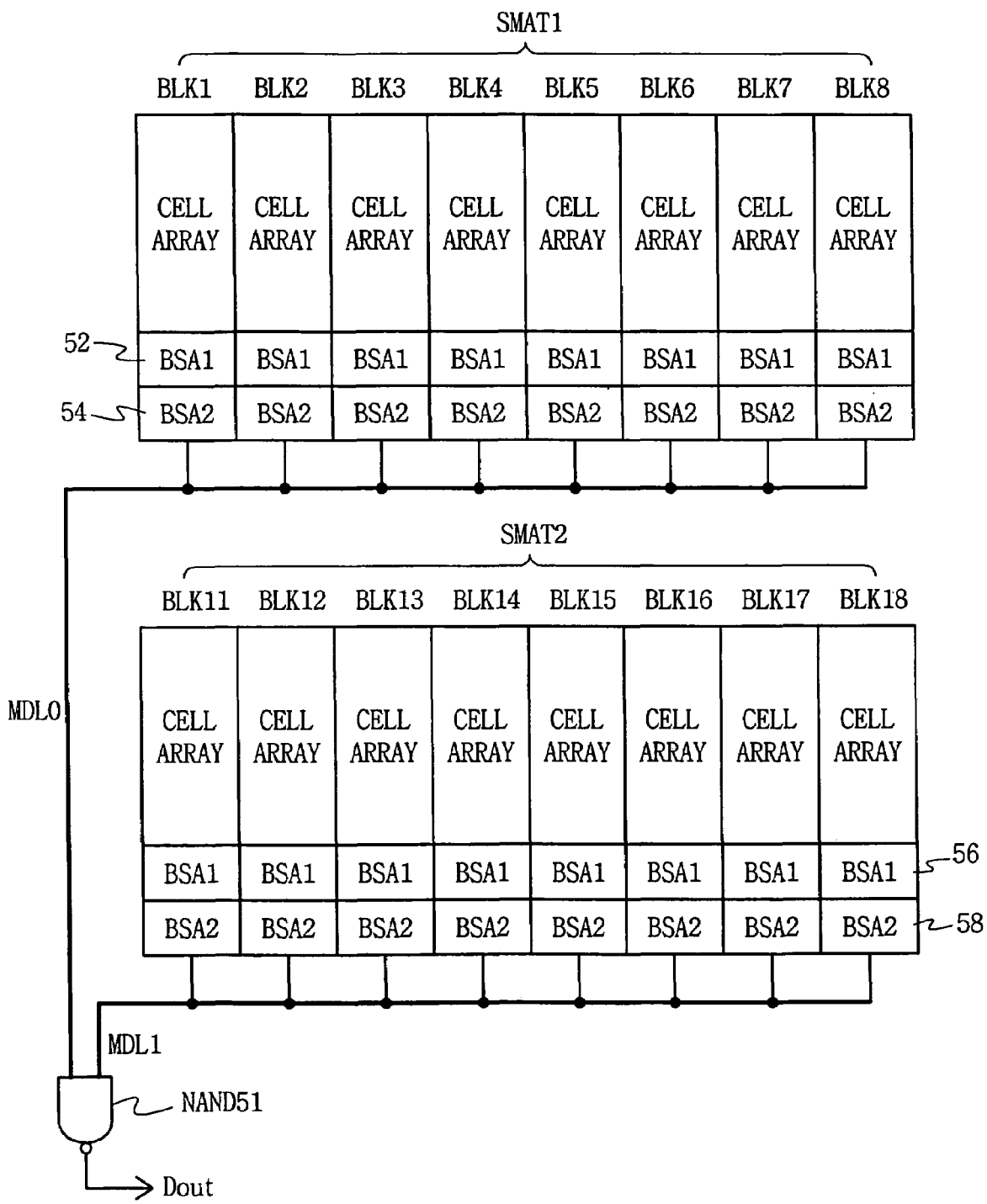
FIG. 5 is a block diagram schematically illustrating sub mats in an SRAM, for a data read path, according to a prior art.
Figure 6:
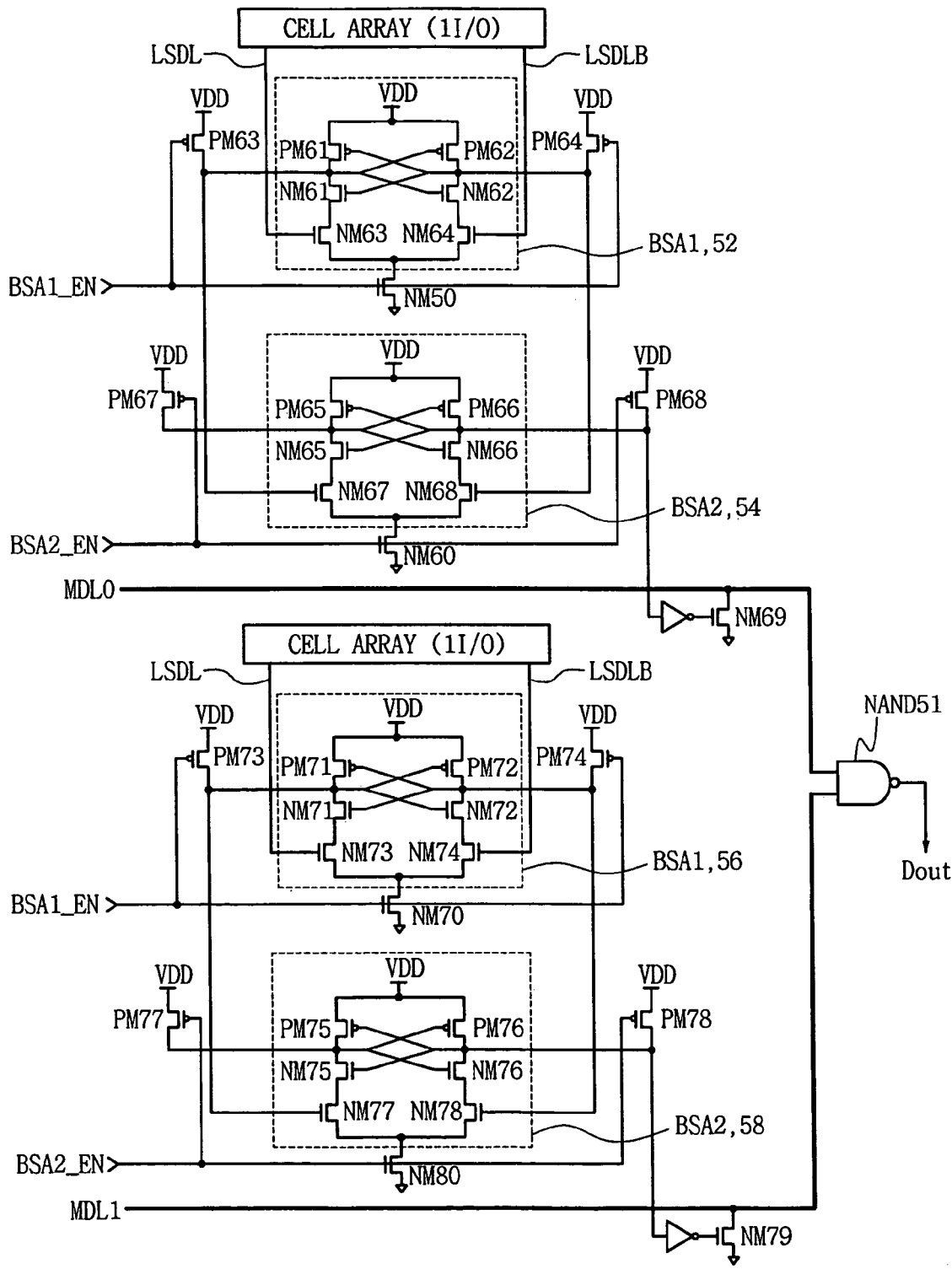
FIG. 6 is a circuit diagram illustrating in detail a data read path of one I/O port within two blocks of FIG. 5.

As described above, in the semiconductor memory device according to a second exemplary embodiment, the number of sense amplifiers is substantially reduced as compared with a conventional semiconductor memory device shown in FIG. 5.

Figure 13:
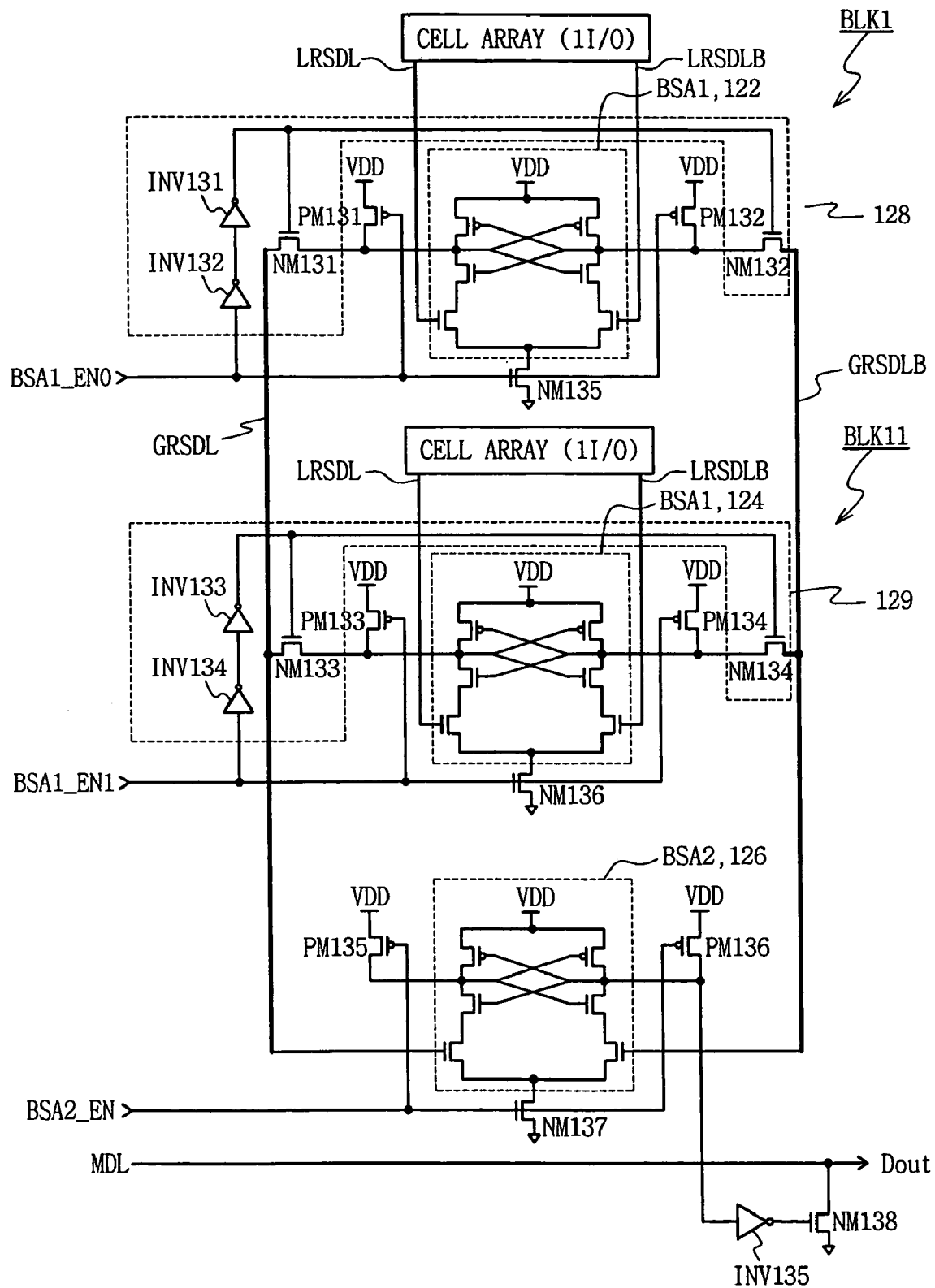
FIG. 13 is a circuit diagram illustrating in detail memory blocks disposed in a column direction shown in FIG. 12.

FIG. 13 is a circuit diagram illustrating in detail memory blocks disposed in the column direction shown in FIG. 12.

With reference to FIG. 13, data read operation of a semiconductor memory device according to the second exemplary embodiment will be described as follows.

It is assumed, for clarity of the invention, that data of a memory cell within a cell array of a memory block BLK1 is read.

One word line is selected by a row decoder (not shown), and then one bit line pair within a memory block BLK1 is selected by a column pass gate (not shown). Data of the bit line pair is transmitted to a local read section data line pair LRSDL, LRSDLB.

A first sense amplifier BSA1, 122 within the memory block BLK1 is enabled by a block selection signal BSA1_EN0, and senses and amplifies data represented on the local read section data line pair LRSDL, LRSDLB. Then the block selection signal BSA1_EN0 is applied to the block selecting unit 128. When the block selection signal BSA1_EN0 is applied high, other block selection signal BSA1_EN1 is applied low.

The block selecting unit 128 includes inverters INV131 and INV132, and gate transistors NM131 and NM132. The block selecting unit 128 delays the block selection signal BSA1_EN0, then electrically connects a global read section data line pair GRSDL, GRSDLB with a first sense amplifier 122.

The block selection signal BSA1_EN0 is delayed by the inverters INV131 and INV132. The block selection signal BSA1_EN0 is delayed and turns on the gate transistors NM131 and NM132.

A second sense amplifier BSA2, 126 receives a second sense amplifier enable signal BSA2_EN and is enabled, and senses and amplifies a signal represented on the global read section data line pair GRSDL, GRSDLB. The signal of the global read section data line pair GRSDL, GRSDLB sensed by the second sense amplifier 126 is not a full-swing signal of a CMOS level, but a small-swing signal of a level lower than the CMOS level. Thus the second sense amplifier 126 senses and amplifies a small-swing signal of the global read section data line pair GRSDL, GRSDLB, and applies the signal to a main data line MDL. Data applied to the main data line MDL is output to an output terminal through an output driver etc.

Though it was described above in the example that the data of memory cell within the cell array of the memory block BLK1 was read, operation except that a block selection signal BSA1_EN1 is applied to a block selecting unit 129 is the same in reading data of memory cell within a cell array of a memory block BLK11.

Figure 14:
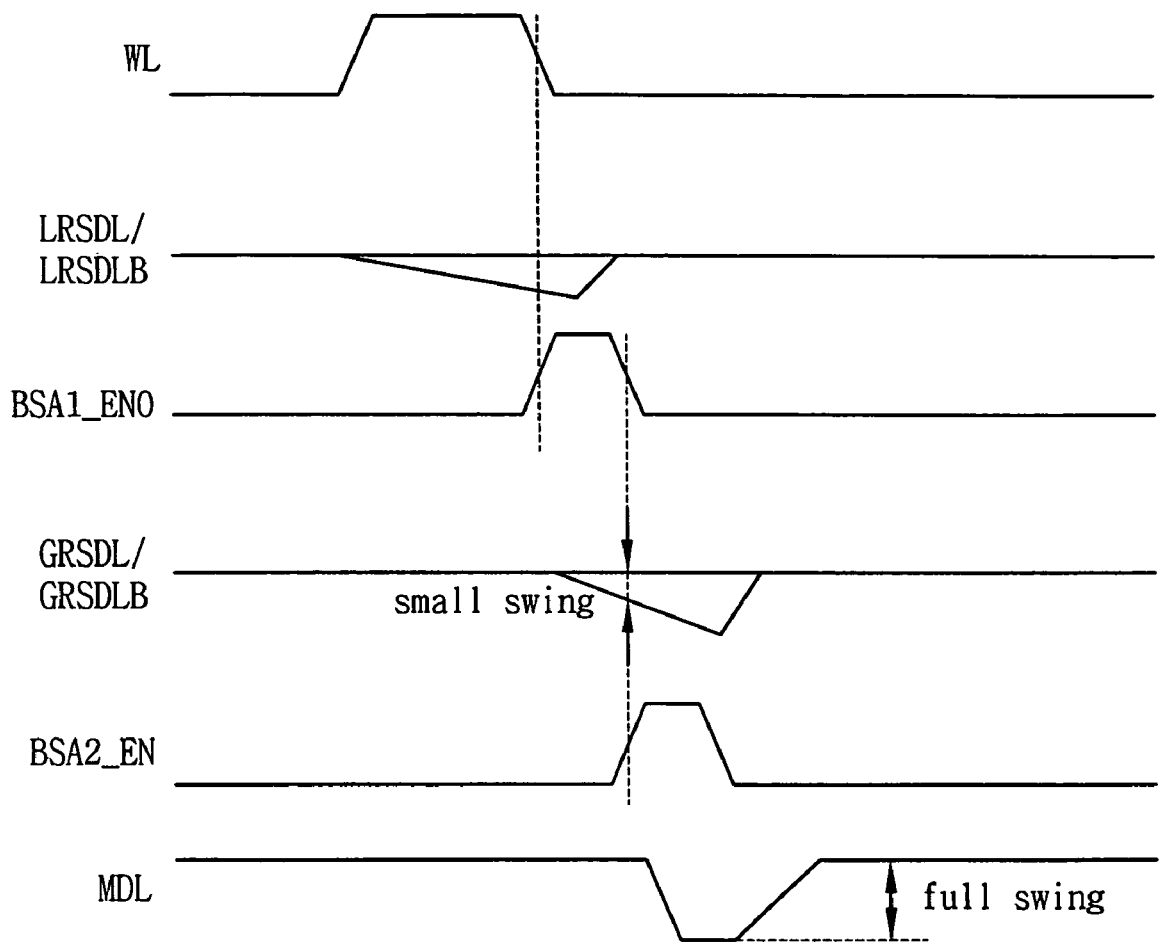
FIG. 14 is a timing diagram illustrating operation of circuit shown in FIG. 13.

FIG. 14 is a timing diagram illustrating operation of the circuit shown in FIG. 13. With reference to FIGS. 13 and 14, a word line WL goes high in response to a row decoder (not shown), then data of a memory cell (not shown) connected to the word line WL is applied to a local read section data line pair LRSDL, LRSDLB. At this time, a signal represented on the local read section data line pair LRSDL, LRSDLB has a small swing width.

At a given point of time when the first sense amplifier 122 senses a signal represented on the local read section data line pair LRSDL, LRSDLB, a block selection signal BSA1_EN0 is applied high. The block selection signal BSA1_EN0 is delayed by the block selecting unit 128, then the first sense amplifier 122 is electrically connected with a global read section data line pair GRSDL, GRSDLB.

The second sense amplifier 126 receives a second sense amplifier enable signal BSA2_EN and is enabled, and then, senses a signal represented on the global read section data line pair GRSDL, GRSDLB, and amplifies the signal to become a full swing to CMOS level. Thus the main data line MDL becomes the full swing to the CMOS level.

As described above with reference to FIGS. 12 to 14, in a semiconductor memory device according to the second exemplary embodiment of the invention, the number of sense amplifiers is reduced and so power consumption and area can be reduced, and the number of main data lines is reduced, and a logical sum operation of signals represented in the main data line is reduced and so an operating speed increases.

Figure 15:
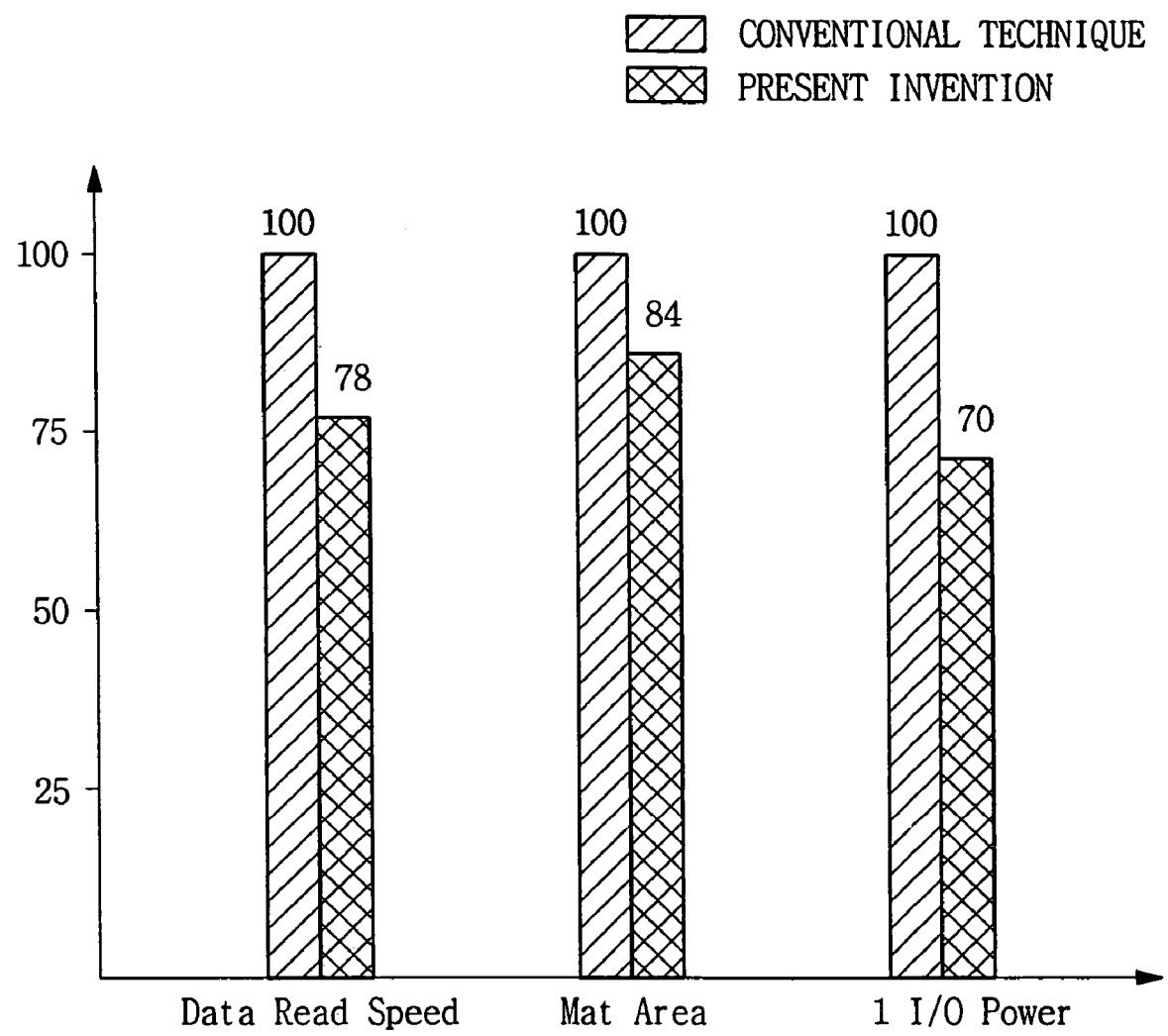
FIG. 15 is a graph of comparing a semiconductor memory device according to a second exemplary embodiment of the invention with a conventional technique, in view of effect.

FIG. 15 is a graph of comparing a semiconductor memory device according to the second exemplary embodiment of the invention with a conventional technique, in view of effect. The conventional technique is for the semiconductor memory device shown in FIG. 5.

With reference to FIG. 15, a semiconductor memory device according to the second exemplary embodiment increases about 22% in a data read speed as compared with the conventional technique, and is reduced about 16% in an area of mat. Also a power consumption of one I/O port is reduced about 30%. Graph in the data read speed indicates a graph for time consumed in a data read.

Subsequently, a semiconductor memory device according to a third exemplary embodiment of the invention will be described referring to FIGS. 8 to 15.

A semiconductor memory device according to the third exemplary embodiment includes a first local sense amplifiers (122 of FIG. 12) for sensing data of a bit line pair connected to a memory cell selected within a first memory block (BLK1 of FIG. 12), and amplifying the data to a first level; a second local sense amplifier 124 for sensing data of a bit line pair connected to a memory cell selected within a second memory block BLK11 that is disposed in the same direction as the first memory block BLK1, as a first direction, and amplifying the data to the first level; and a global sense amplifier 126 for sensing an output signal from any one local sense amplifier among the first and second local sense amplifiers 122 and 124, and amplifying the signal to a second level higher than the first level. Memory cells connected to each of the bit line pairs are operationally divided into a first memory cell cluster MCC1(FIG. 9) and a second memory cell cluster MCC2(FIG. 9). The semiconductor memory device may further include a plurality of global bit line pairs, e.g., GBL1 and GBL1B of FIG. 9, of which each one is disposed corresponding to at least two of the bit line pairs. The semiconductor memory device may further include a cluster selecting unit BMUX_1, BMUX_2 to access to one memory cell cluster of the first memory cell cluster MCC1, MCC3 (FIG. 9) and the second memory cell cluster MCC2, MCC4 (FIG. 9), each of the first and second memory cell clusters being connected with bit line pairs BL1, BL1B, BL2 and BL2B (FIG. 9) corresponding to one global bit line pair GBL1, GBL1B (FIG. 9) of the global bit line pairs.

The first direction may be a column direction, and the first level is voltage lower than a CMOS level and the second level is voltage at CMOS level. The semiconductor memory device may be an SRAM having static type memory cells.

That is, the semiconductor memory device according to the third exemplary embodiment of the invention contains all of advantages provided in the first and second exemplary embodiments of the invention.

Accordingly, in the semiconductor memory device according to the third exemplary embodiment, a load of bit line and the number of column pass gates are reduced, and so the number of sense amplifiers and a logical sum operation of main data line pairs are reduced, and also an operating speed increases and a power consumption in a high density is reduced.

A semiconductor memory device according to a fourth exemplary embodiment of the invention will be described referring to FIGS. 16 to 19, as follows.

Figure 16:
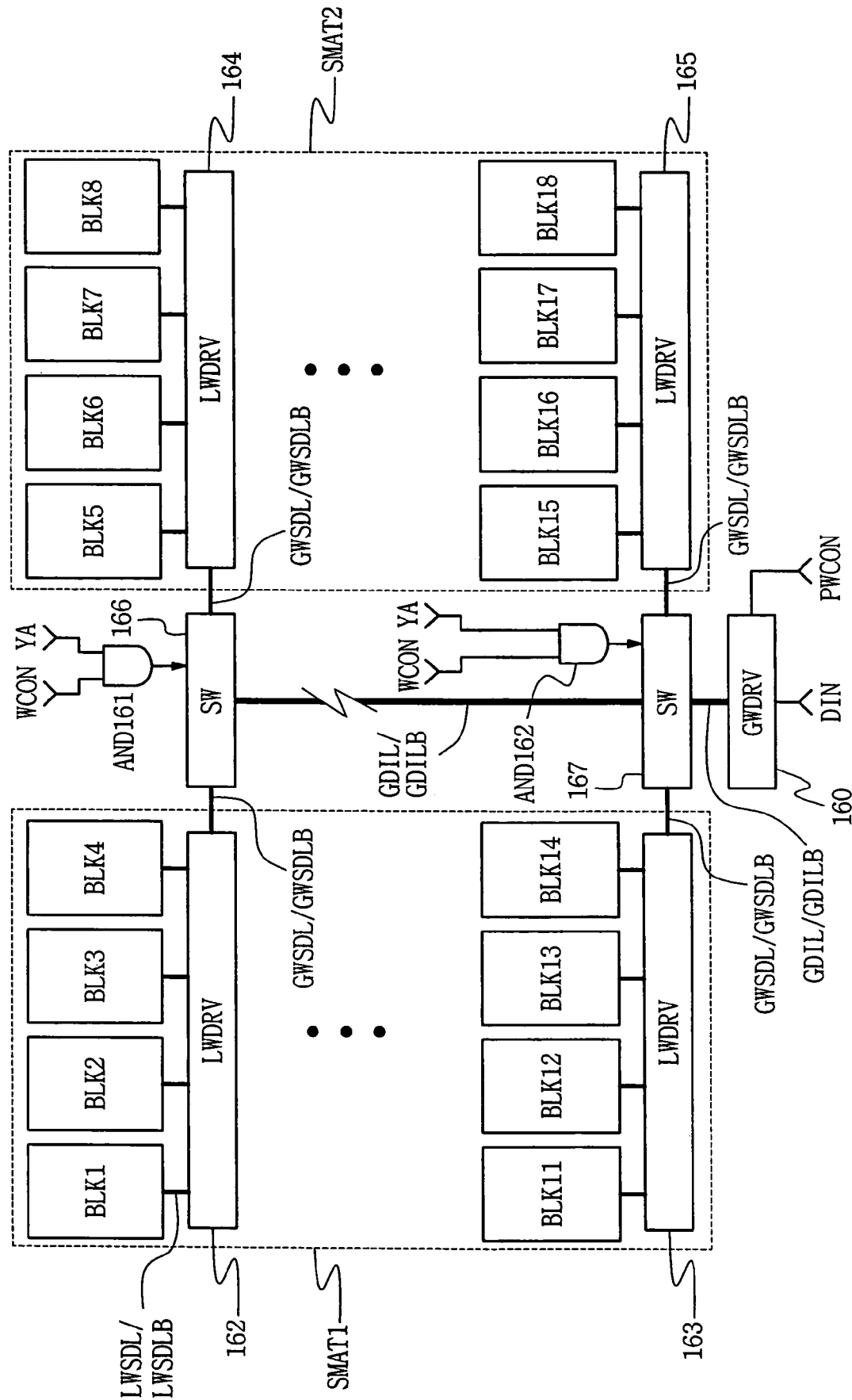
FIG. 16 is a block diagram of semiconductor memory device according to a fourth exemplary embodiment of the invention.

FIG. 16 is a block diagram of semiconductor memory device according to a fourth exemplary embodiment of the invention.

As shown in FIG. 16, a semiconductor memory device according to a fourth exemplary embodiment includes a write driving circuit for receiving data DIN and writing the data to a memory cell. The write driving circuit includes a first write driver unit GWDRV, 160 and a second writer driver unit LWDRV, 162 to 165. The semiconductor memory device may be an SRAM having static type memory cells.

The first write driver unit 160 drives data to a level lower than a level of data to be written to the memory cell. The driven data is output to a first data input line pair GDIL, GDILB. The level of data to be written to the memory cell may have a CMOS level. The first write driver units 160 may be allocated and disposed per I/O port. The driving procedure the first write driver unit 160 drives data to a level lower than a level of data to be written to the memory cell, will be described referring to FIGS. 17 and 18, as follows.

The second write driver unit 162-165 receives data from the first write driver unit 160, and drives to a level of data to be written to the memory cell. The second write driver unit 162-165 provides the data that was driven to the level of data to be written to the memory cell, to a selection bit line pair connected to the memory cell. The selection bit line pair connected to the memory cell designates a bit line pair selected by an address.

The semiconductor memory device according to the fourth exemplary embodiment may further include a data line selecting unit SW, 166, 167. The data line selecting unit 166, 167 receives a composite signal of write command signal WCON and a column address YA, and may perform a switching so that data of the first data input line pair GDIL, GDILB is applied to the second write driver unit 162-165. The switching operation of the data line selecting unit 166, 167 will be described referring to FIG. 17, as follows.

Figure 17:
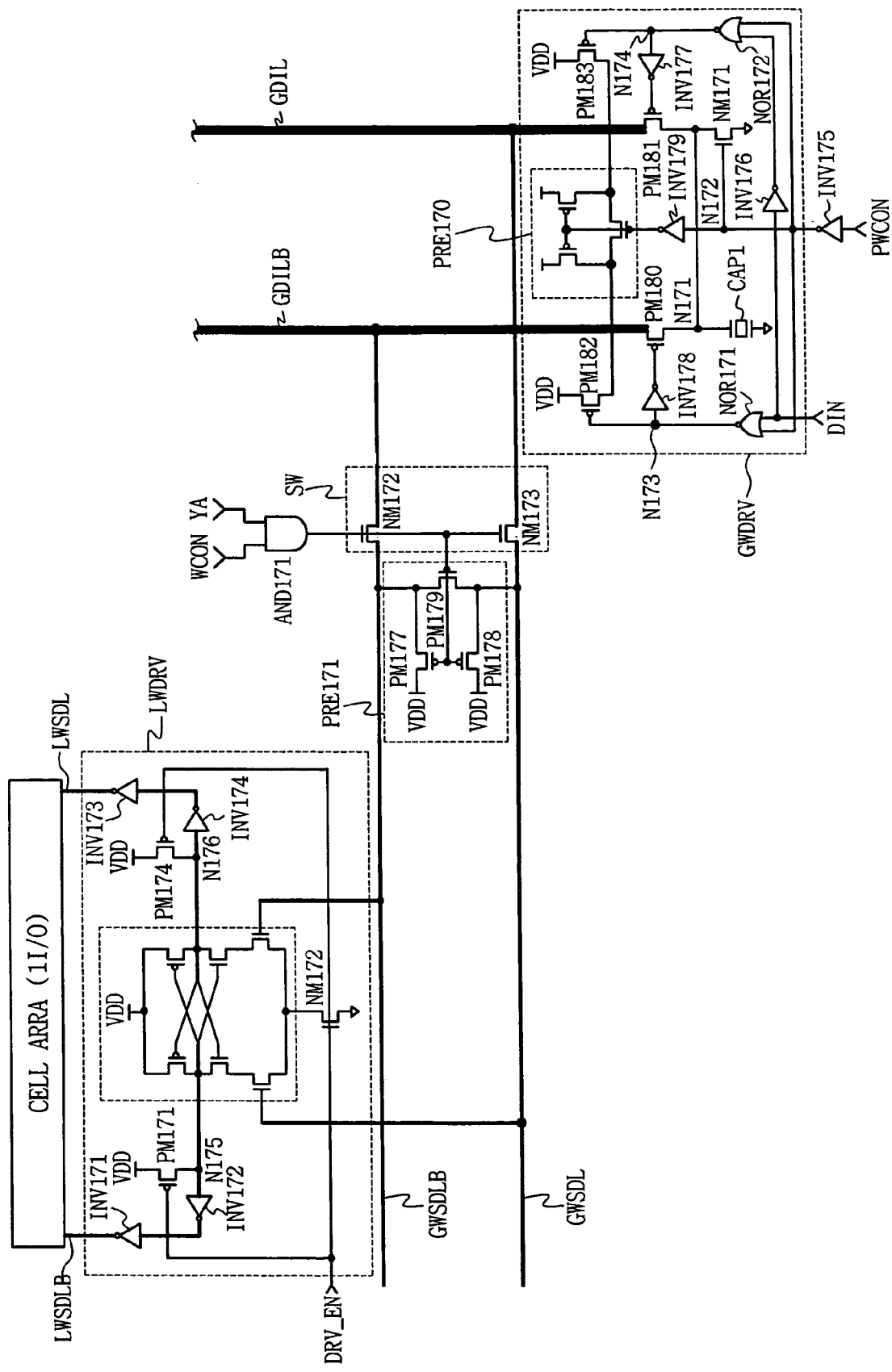
FIG. 17 is a circuit diagram illustrating in detail a write driving circuit in one I/O port shown in FIG. 16.
Figure 18:
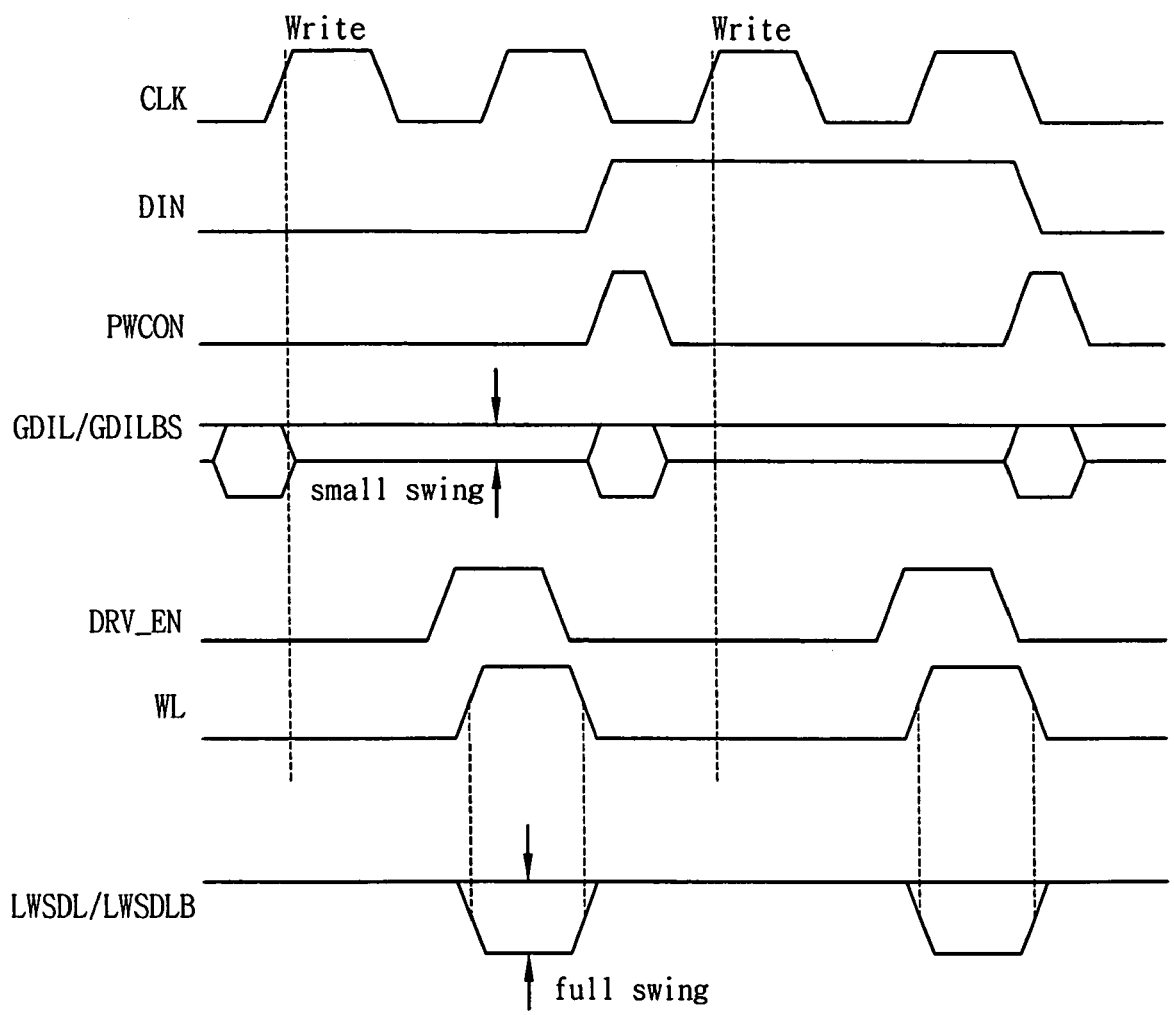
FIG. 18 is a timing diagram for a write driving circuit of FIG. 17.

FIG. 17 is a circuit diagram illustrating in detail a write driving circuit in one I/O port shown in FIG. 16. FIG. 18 is a timing diagram for a write driving circuit of FIG. 17.

FIG. 17 illustrates a first write driver unit GWDRV, a data line selecting unit SW, a data line precharge unit PRE171 and a second write driver unit LWDRV The precharge unit PRE171 precharges respective global write section data line pair GWSDL, GWSDLB.

The writing procedure to the memory cell within a cell array will be described as follows.

First, in case a write command signal WCON is not applied, the first data input line pair GDIL, GDILB is precharged by a precharge unit PRE170.

When pulse PWCON generated by a short pulse generator (not shown) for receiving the write command signal WCON is applied, the precharge unit PRE170 is disconnected from the first data input line pair GDIL, GDILB. A logical NOR operation is performed by an NOR gate NOR171, NOR172, and a signal resulting from the NOR operation selectively turns on a PMOS transistor PM182, PM183, and data is output to the first data input line pair GDIL, GDILB. At this time, before the data is output to the first data input line pair GDIL, GDILB, a charge sharing is performed by a charge sharing capacitor CAP1.

For example, when data DIN to be written to the memory cell is applied as a high level, an output signal of the NOR gate NOR172 becomes a high level, and an output signal of the NOR gate NOR172 is inverted by an inverter INV177, and consequently a PMOS transistor PM181 is turned ON. In this case, a PMOS transistor PM180 has a turn-off state. When the PMOS transistor PM181 is turned ON, the first data input line GDIL and the charge sharing capacitor CAP are electrically connected to perform a charge sharing operation. As shown in FIG. 18, thus, data of the first data input line pair GDIL, GDILB is reduced in a swing width, and this is data having a level lower than a level of data to be written to a memory cell.

The data line selecting unit SW performs a switching to connect the first data input line pair GDIL, GDILB to a global write section data line pair GWSDL, GWSDLB. The data line selecting unit SW is controlled by an AND logical operation result signal of a write command signal WCON and a column address. When all of the write command signal WCON and the column address have a high level, the data line selecting unit SW is turned ON to electrically connect the first data input line pair GDIL, GDILB with a global write section data line pair GWSDL, GWSDLB. Thus data of the first data input line pair GDIL, GDILB is transmitted to the global write section data line pair GWSDL, GWSDLB. That is, the timing diagram of the global write section data line pair GWSDL, GWSDLB is substantially the same as the timing diagram of the first data input line pair GDIL, GDILB shown in FIG. 18.

When a driver enable signal DRV_EN is applied, the second write driver unit LWDRV is enabled, to sense and amplify data represented on the global write section data line pair GWSDL, GWSDLB.

The second write driver unit LWDRV generates a full-swing data at CMOS level. The data amplified by the second write driver unit LWDRV is output to a local write section data line pair LWSDL, LWSDLB and to a selected bit line pair. Then the full-swing data at CMOS levels is written to a memory cell selected by the word line WL.

Figure 7:
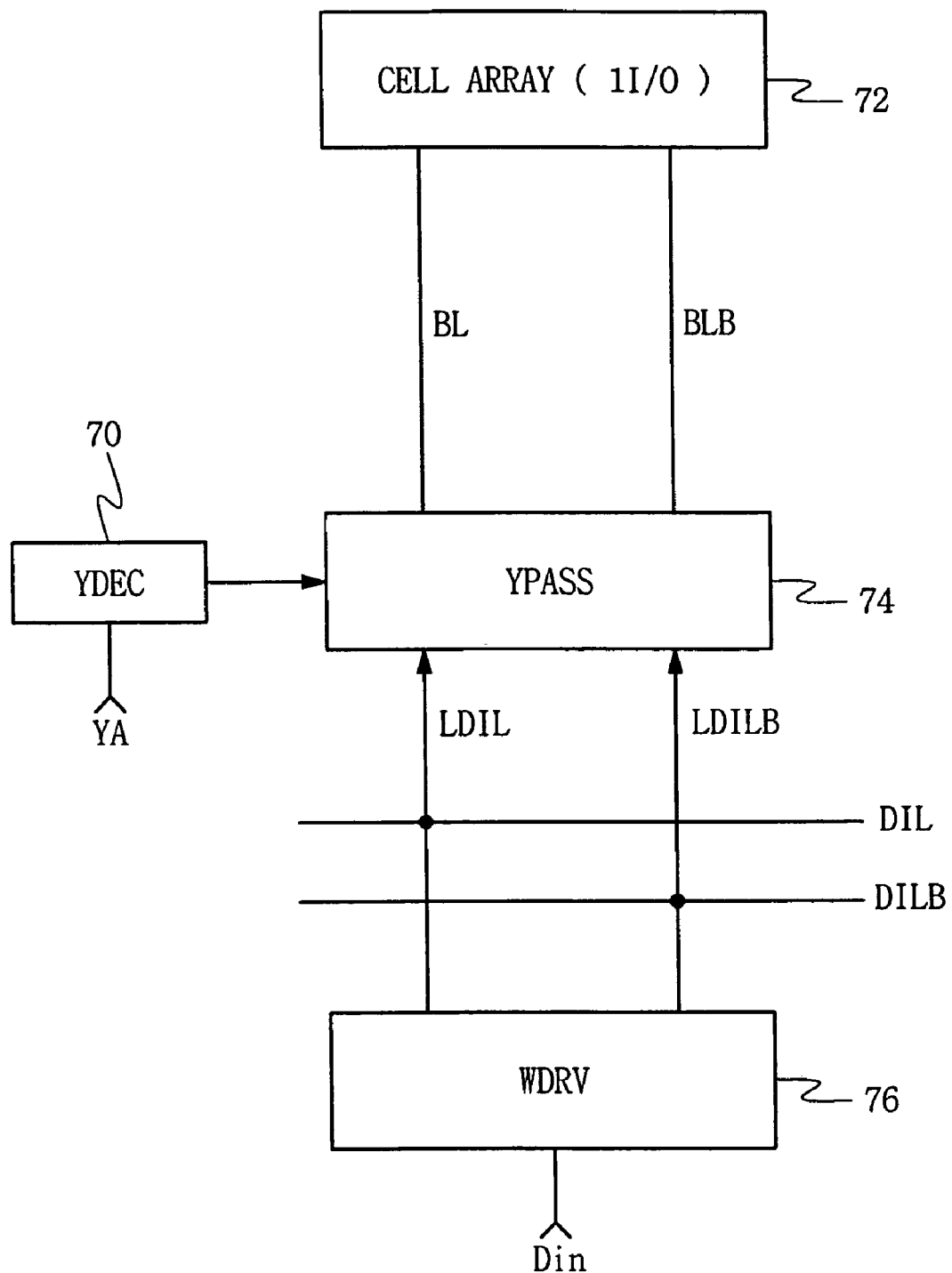
FIG. 7 is a block diagram schematically illustrating one I/O port in an SRAM, for a data write path according to a prior art.

In the data write path of conventional semiconductor memory device shown in FIG. 7, the full-swing data at CMOS level is transmitted to a data input line pair DIL, DILB (FIG. 7) through use of a write driver unit 76 (FIG. 7). As described above, however, a small-swing data is transmitted to a data input line pair such as a first data input line pair and a global write section data line pair etc. by the write driving circuit of semiconductor memory device according to the fourth exemplary embodiment of the invention. A second write driver unit drives the small-swing data to a level to be written to a memory cell, and provides the data to a selection bit line connected to the memory cell. Further, the small swing data that was transmitted to the data input line pair, is insensitive to noise of the device exterior, thus preventing error in operation.

Accordingly, the semiconductor memory device according to the fourth exemplary embodiment has a small power consumption and an improved operating speed.

Figure 19:
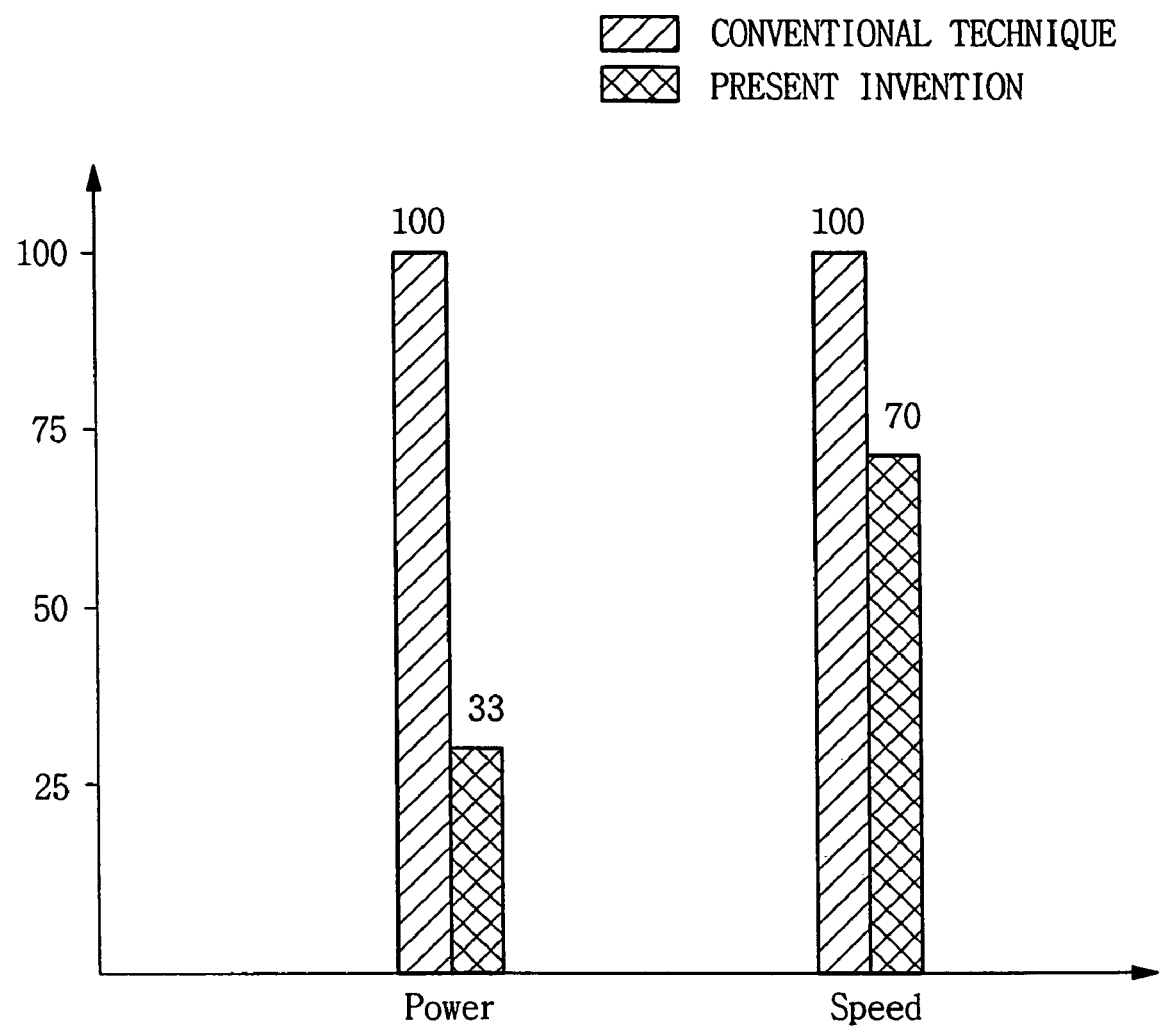
FIG. 19 is a graph of comparing a semiconductor memory device according to a fourth exemplary embodiment of the invention with a conventional technique, in view of effect.

FIG. 19 is a graph of comparing the semiconductor memory device according to the fourth exemplary embodiment of the invention with the conventional technique, in view of effect.

Referring to FIG. 9, a power consumption in the semiconductor memory device according to the fourth exemplary embodiment is reduced about 67% as compared with the semiconductor memory device of conventional technique. In view of an operating speed, the semiconductor memory device according to the fourth exemplary embodiment increases about 30%. A graph of FIG. 19 represented in 'Speed' indicates time taken in a data write operation.

A semiconductor memory device according to a fifth exemplary embodiment of the invention will be described as follows, referring to FIG. 20 and FIGS. 13 to 19.

Figure 20:
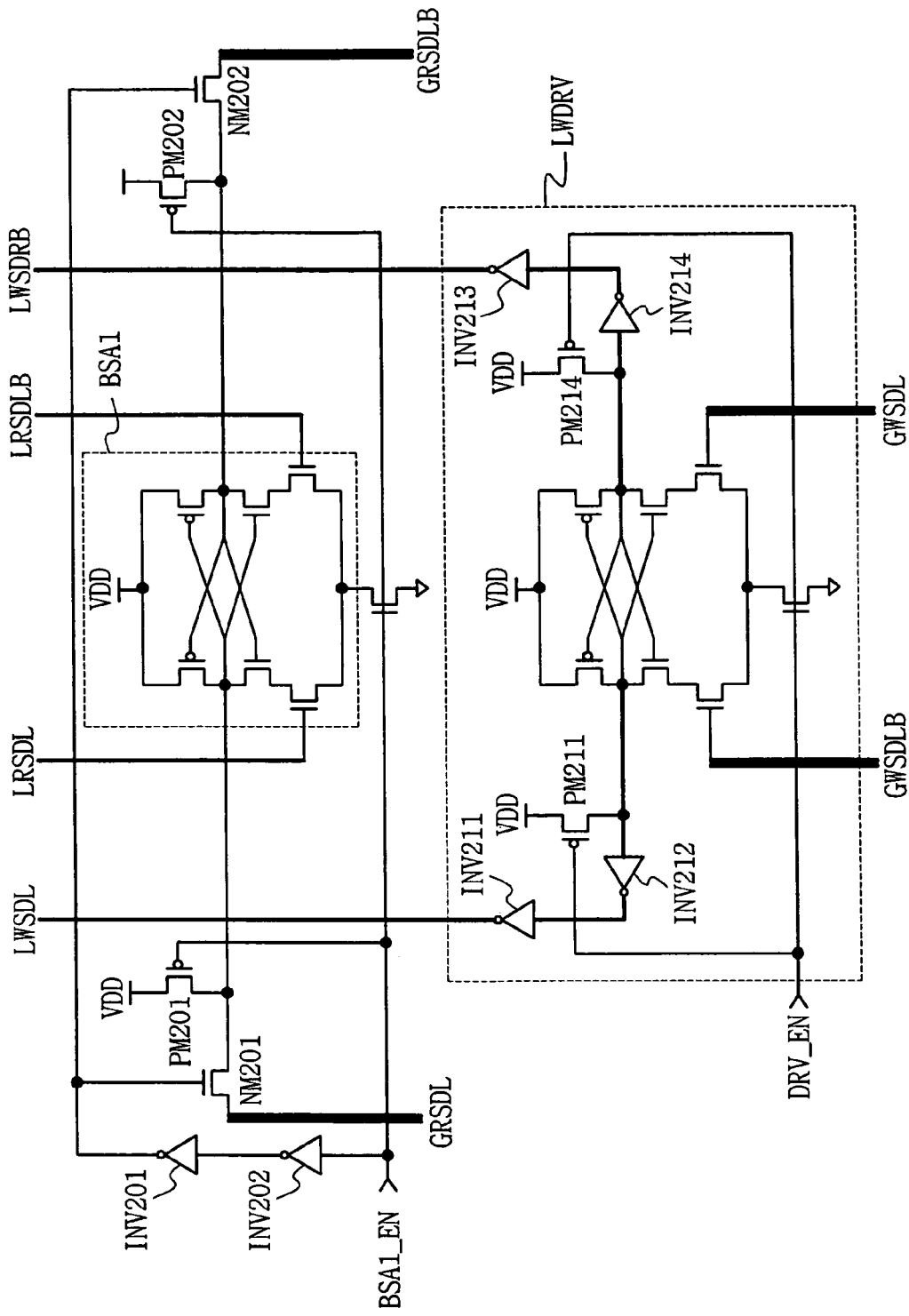
FIG. 20 is a circuit diagram illustrating a semiconductor memory device according to a fifth exemplary embodiment of the invention.

FIG. 20 is a circuit diagram illustrating a semiconductor memory device according to the fifth exemplary embodiment of the invention.

FIG. 20 partially illustrates a data read path, in which data of a bit line pair selected within any one of a plurality of memory blocks is sensed by a local sense amplifier BSA1; and a data write path, in which a second write driver unit LWDRV receives data from a global write section data line pair GWSDL, GWSDLB, drives the data to a level of data to be written to a memory cell, and provides the data to a selection bit line pair connected to the memory cell.

In the data read path, a path after the local sense amplifier BSA1 is not shown in FIG. 20, but is the same as the global sense amplifier BSA2 of FIG. 13 connected to the global read section data line pair GRSDL, GRSDLB of FIG. 13.

In the data write path, a path before the second write driver unit LWDRV is not shown in FIG. 20, but is the same as the first write driver unit GWDRV of FIG. 17 that drives data to a level lower than a level of data to be written to a memory cell.

In the semiconductor memory device according to the fifth exemplary embodiment, in a data read operation, data of a bit line pair selected within any one of a plurality of memory blocks is sensed by a local sense amplifier BSA1 and is amplified to data of a first level. Also an output data from the local sense amplifier BSA1 is sensed by a global sense amplifier BSA2 (FIG. 13) shared by the local sense amplifier BSA1 within another one or more memory blocks, and is amplified to data of a second level higher than the first level.

In the semiconductor memory device according to the fifth exemplary embodiment, in a data write operation, a first write driver unit GWDRV receives write data and drives the data to a level lower than a level of data to be written to a memory cell, and outputs the data to a first data input line pair. A second write driver unit LWDRV receives data from the first write driver unit GWDRV, and drives the data to a level of data to be written to the memory cell, and provides the data to a selection bit line pair connected to the memory cell.

Accordingly, the semiconductor memory device according to the fifth exemplary embodiment increases an operating speed and reduces a power consumption.

As described above, a semiconductor memory device having a hierarchical bit line structure according to exemplary embodiments of the invention improves an operating speed decrease caused by a load of peripheral circuits connected to a bit line.

Further, the number of column pass gates is substantially reduced, thus reducing a chip size.

In addition, a semiconductor memory device having an improved data read path reduces a path of full-swing data of a CMOS level in a data read operation, thereby reducing a power consumption. Also, in the data read operation, a data read operating speed increases by reducing the path of full-swing data at CMOS level in the data read operation.

The number of sense amplifiers disposed per memory block is reduced, thus reducing a chip size.

A semiconductor memory device having an improved data write path reduces a path of full-swing data of a CMOS level in a data write operation, thereby reducing a power consumption. Also, in the data write operation, a data write operating speed increases by reducing the path of full-swing data at CMOS level in the data write operation.

Additionally, in the data write operation, a small-swing data is transmitted to a data input line pair so as to be insensitive to noise from the device exterior, thus substantially reducing error in operation.

It will be apparent to those skilled in the art that modifications and variations can be made to the foregoing embodiments of the invention without deviating from the scope of the invention. Thus, it is intended that the present invention cover any such modifications and variations provided they come within the scope of the appended claims and their equivalents.

What is claimed is:

1. A semiconductor memory device, comprising:
   first and second memory cell clusters sharing a first bit line pair;
   third and fourth memory cell clusters connected respectively to word lines coupled to the first and second memory cell clusters, and sharing a second bit line pair different from the first bit line pair; and
   a column pass gate adapted to switch one of the first and second bit line pairs to a common sense amplifier in response to a column selection signal, the one of the bit line pairs being connected to one of the memory cell clusters.

2. The device of claim 1, further comprising a cluster selecting unit adapted to receive a cluster selection signal and further adapted to select one of the first through fourth memory cell clusters.

3. The device of claim 2, wherein the cluster selection signal is a signal generated by a logical operation performed on a column address and a row address.

4. The device of claim 2, wherein the cluster selecting unit comprises gate transistors controlled by the cluster selection signal and adapted to operationally divide the first through fourth memory cell clusters.

5. The device of claim 4, wherein the gate transistors are N-type Metal Oxide Semiconductor (NMOS) transistors.

6. The device of claim 1, wherein memory cells constituting the first through fourth memory cell clusters are static type memory cells.

7. A semiconductor memory device having a plurality of bit line pairs, each bit line pair connecting a plurality of memory cells that are operationally divided into first and second memory cell clusters, the memory device comprising:
   a plurality of global bit line pairs, each one disposed in relation to at least two of the plurality of bit line pairs;
   a cluster selecting unit adapted to access one of the first and second memory cell clusters, wherein each of the first and second memory cell clusters is connected to bit line pairs corresponding to one of the global bit line pairs; and
   a plurality of column pass gates, each being disposed in relation to a global bit line, adapted to receive a column selection signal, and further adapted to connect the global bit line pair to a common sense amplifier.

8. The device of claim 7, further comprising a cluster selection signal generating unit adapted to perform a logical operation on a column address and a row address to generating a cluster selection signal.

9. The device of claim 8, wherein the cluster selecting unit is controlled by the cluster selection signal.

10. The device of claim 8, wherein the cluster selecting unit comprises gate transistors adapted to control connection between each bit line pair and a corresponding global bit line pair.

11. The device of claim 10, wherein the gate transistors are NMOS transistors.

* * * * *